United States Patent
Kusunoki et al.

(10) Patent No.: US 11,322,329 B2
(45) Date of Patent: May 3, 2022

(54) ELECTRON SOURCE, METHOD FOR MANUFACTURING THE SAME, AND ELECTRON BEAM DEVICE USING THE SAME

(71) Applicant: HITACHI HIGH-TECH CORPORATION, Tokyo (JP)

(72) Inventors: Toshiaki Kusunoki, Tokyo (JP); Tomihiro Hashizume, Tokyo (JP); Keigo Kasuya, Tokyo (JP); Noriaki Arai, Tokyo (JP); Hiromitsu Seino, Tokyo (JP); Minoru Kaneda, Tokyo (JP); Takashi Ohshima, Tokyo (JP); Soichiro Matsunaga, Tokyo (JP)

(73) Assignee: HITACHI HIGH-TECH CORPORATION, Tokyo (JP)

(*) Notice: Subject to any disclaimer, the term of this patent is extended or adjusted under 35 U.S.C. 154(b) by 0 days.

(21) Appl. No.: 17/260,612

(22) PCT Filed: Aug. 27, 2018

(86) PCT No.: PCT/JP2018/031497
§ 371 (c)(1),
(2) Date: Jan. 15, 2021

(87) PCT Pub. No.: WO2020/044389
PCT Pub. Date: Mar. 5, 2020

(65) Prior Publication Data
US 2021/0327674 A1 Oct. 21, 2021

(51) Int. Cl.
*H01J 37/065* (2006.01)
*H01J 37/10* (2006.01)
(Continued)

(52) U.S. Cl.
CPC .......... *H01J 37/065* (2013.01); *H01J 37/10* (2013.01); *H01J 37/1474* (2013.01);
(Continued)

(58) Field of Classification Search
CPC ...... H01J 37/065; H01J 37/10; H01J 37/1474; H01J 37/244; H01J 37/28; H01J 37/06;
(Continued)

(56) References Cited

U.S. PATENT DOCUMENTS 4,482,939 A * 11/1984 Tishman ............... B60Q 1/076
362/513
5,834,781 A 11/1998 Fukuhara et al.
(Continued)

FOREIGN PATENT DOCUMENTS

JP 09-283068 A 10/1997
JP 2017-157368 A 9/2017
(Continued)

OTHER PUBLICATIONS

Haruto Nagata, et al., "Thermal field emission obervation of single-crystal LaB6", J. Appl. Phys. vol. 68, No. 7, Oct. 1, 1990, p. 3614-3618.
(Continued)

*Primary Examiner* — Jason L McCormack
(74) *Attorney, Agent, or Firm* — Mattingly & Malur, PC

(57) ABSTRACT

The invention provides an electron source including a columnar chip of a hexaboride single crystal, a metal pipe that holds the columnar chip of the hexaboride single crystal, and a filament connected to the metal pipe at a central portion. The columnar chip of the hexaboride single crystal is formed into a cone shape at a portion closer to a tip than a portion held in the metal pipe, and a tip end portion having the cone shape has a (310) crystal face. Schottky electrons are emitted from the (310) crystal face. According to the
(Continued)

invention, it is possible to provide a novel electron source having monochromaticity, long-term stability of an emitter current, and high current density.

11 Claims, 30 Drawing Sheets

(51) Int. Cl.
*H01J 37/147* (2006.01)
*H01J 37/244* (2006.01)
*H01J 37/28* (2006.01)

(52) U.S. Cl.
CPC ............ *H01J 37/244* (2013.01); *H01J 37/28* (2013.01); *H01J 2237/0473* (2013.01); *H01J 2237/06316* (2013.01); *H01J 2237/2448* (2013.01)

(58) Field of Classification Search
CPC ..... H01J 2237/0473; H01J 2237/06316; H01J 2237/2448; H01J 1/148; H01J 1/15; H01J 9/04
USPC .................................. 250/310, 306, 307, 311
See application file for complete search history.

(56) References Cited

U.S. PATENT DOCUMENTS

| | | | |
|---|---|---|---|
| 6,087,667 A * | 7/2000 | Nakasuji | ................. H01J 37/06 250/492.2 |
| 2013/0200788 A1 * | 8/2013 | Cho | ....................... H01J 37/073 315/1 |
| 2015/0002009 A1 | 1/2015 | Zhang et al. | |
| 2019/0066966 A1 | 2/2019 | Kusunoki et al. | |
| 2019/0237289 A1 | 8/2019 | Kasuya et al. | |

FOREIGN PATENT DOCUMENTS

| WO | 2014/007121 A1 | 1/2014 |
|---|---|---|
| WO | 2016/167048 A1 | 10/2016 |
| WO | 2018/007001 A1 | 1/2018 |
| WO | 2018/070010 A1 | 4/2018 |

OTHER PUBLICATIONS

International Search Report of PCT/JP2018/031497 dated Nov. 20, 2018.

* cited by examiner

[FIG. 1A]
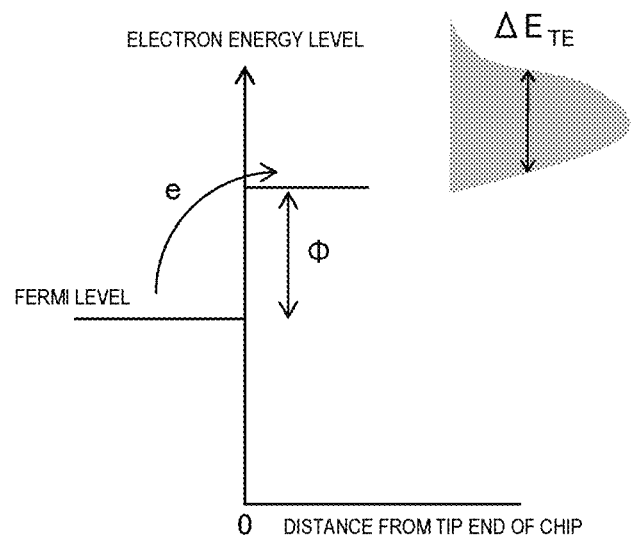
[FIG. 1B]
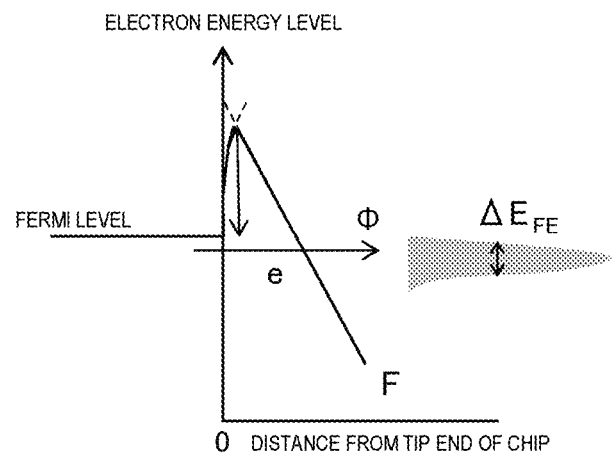

[FIG. 1C]
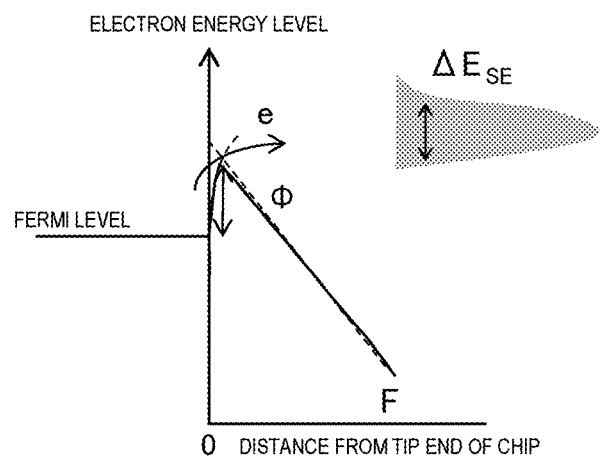
[FIG. 2]
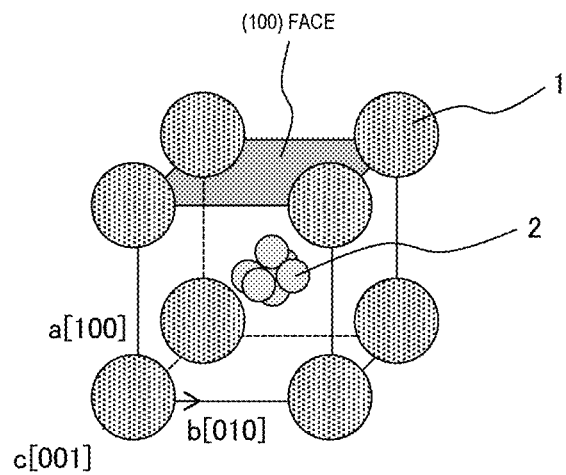

[FIG. 3]
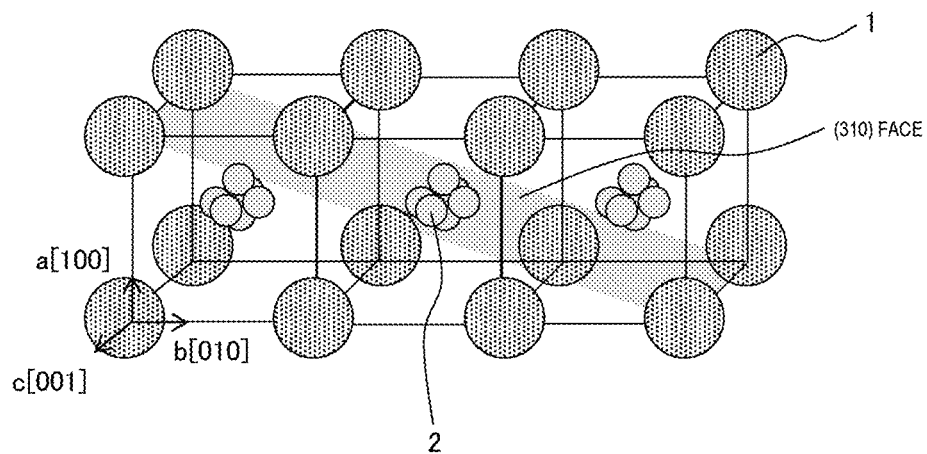
[FIG. 4]
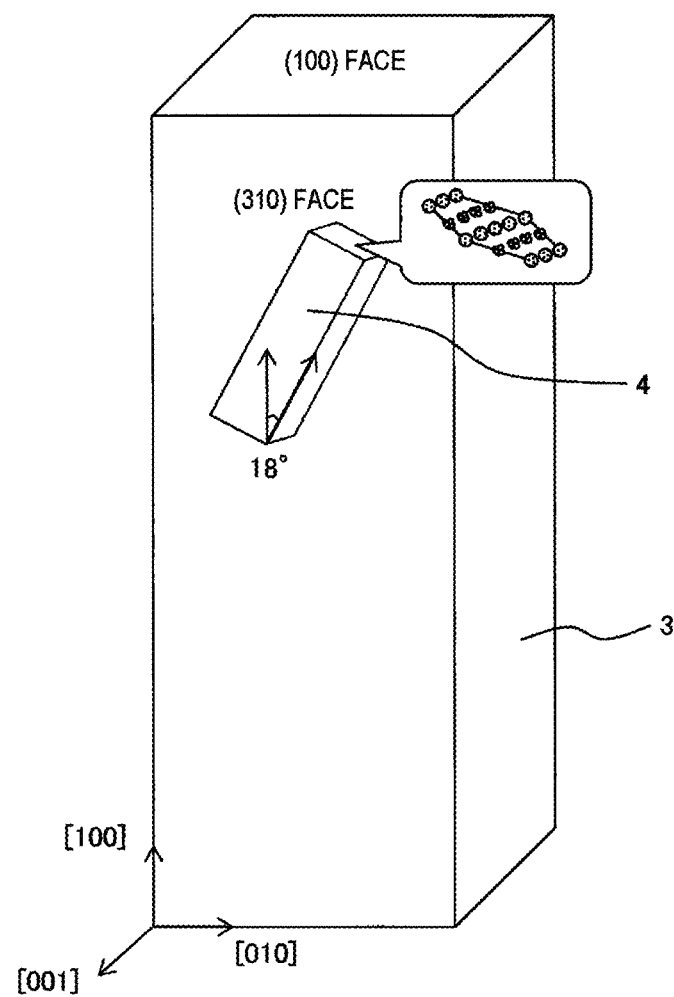

[FIG. 5]
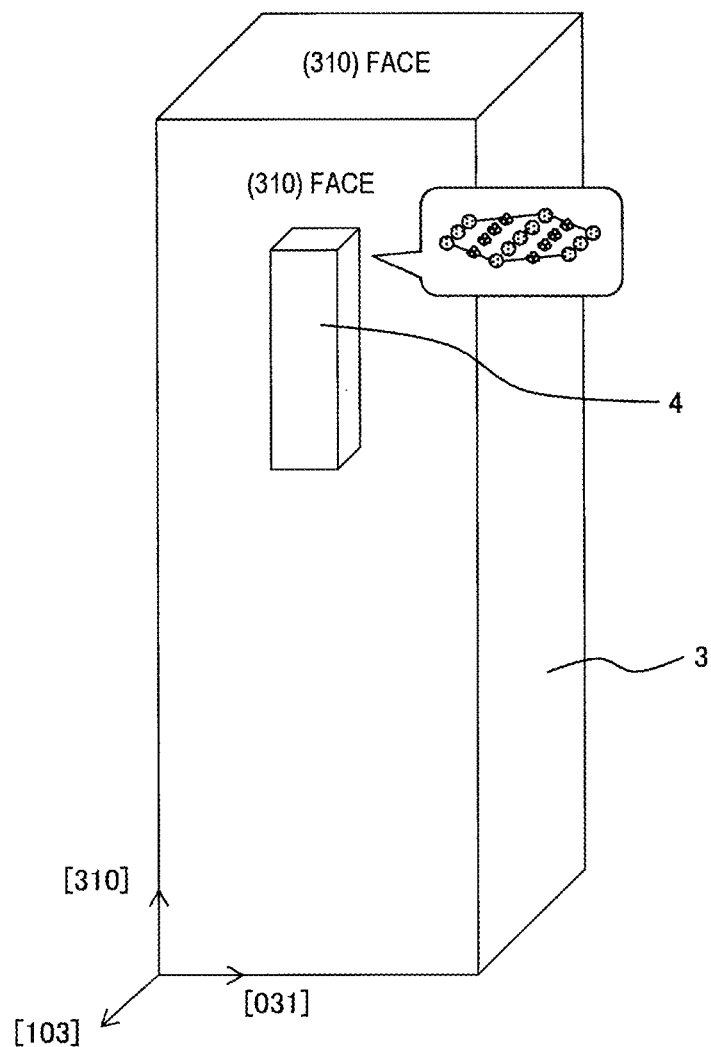

[FIG. 6]
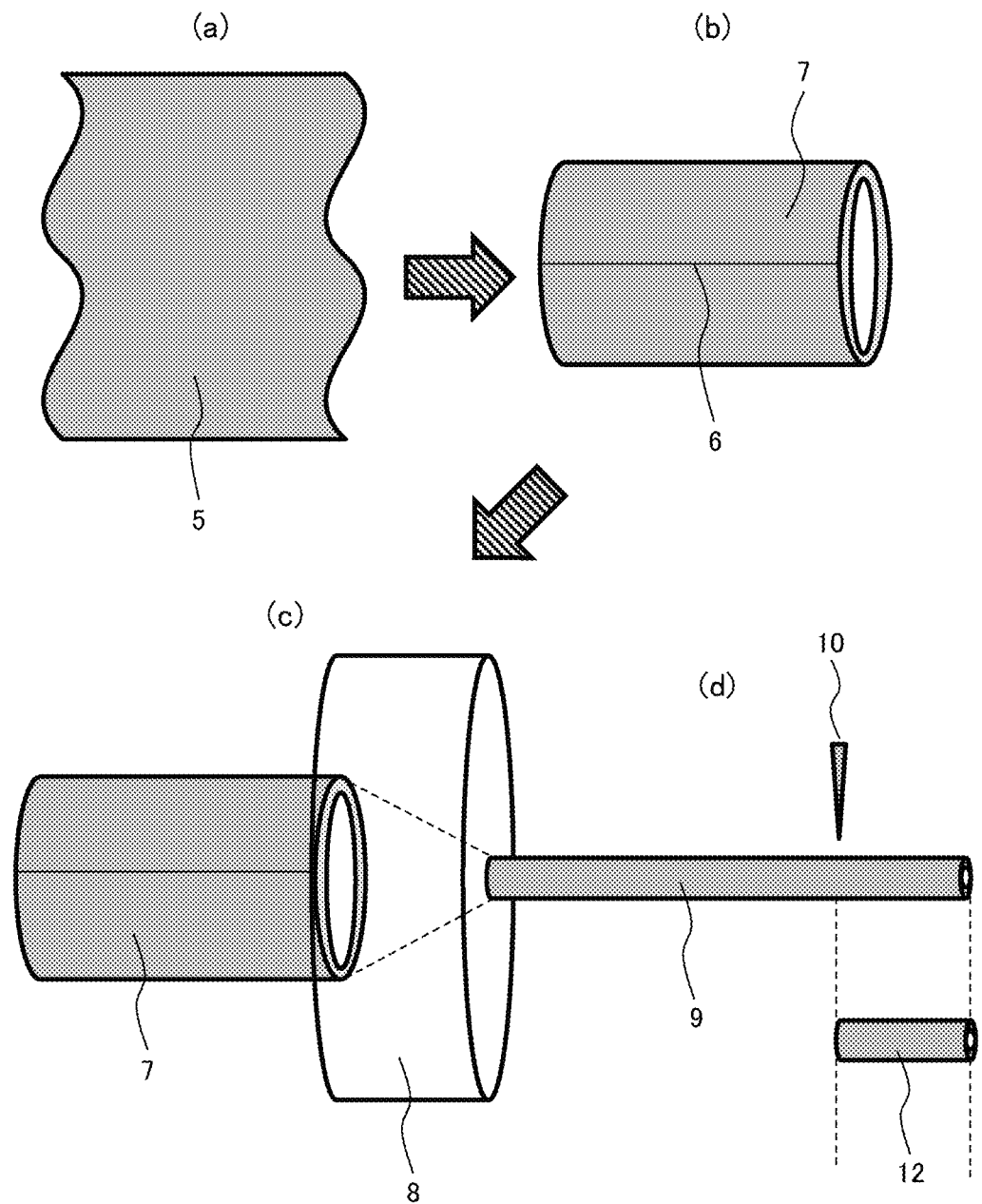

[FIG. 7]
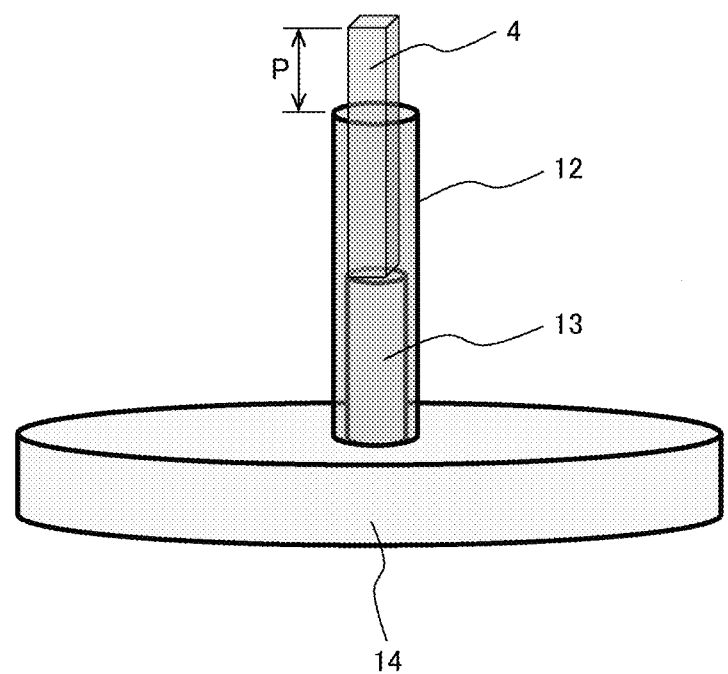

[FIG. 8]
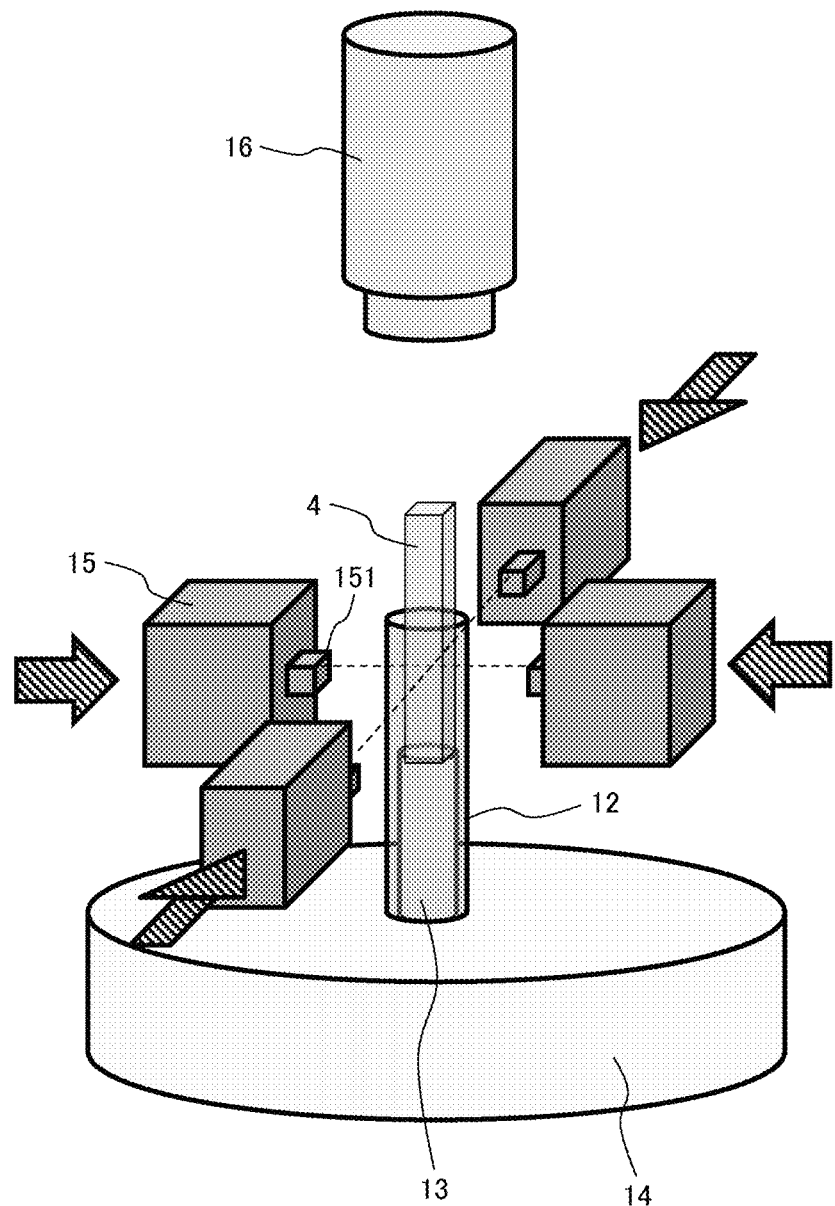

[FIG. 9A]
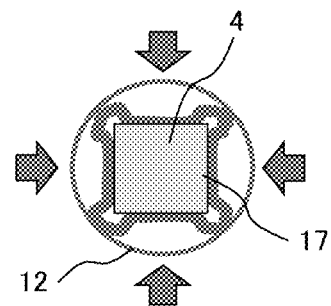
[FIG. 9B]
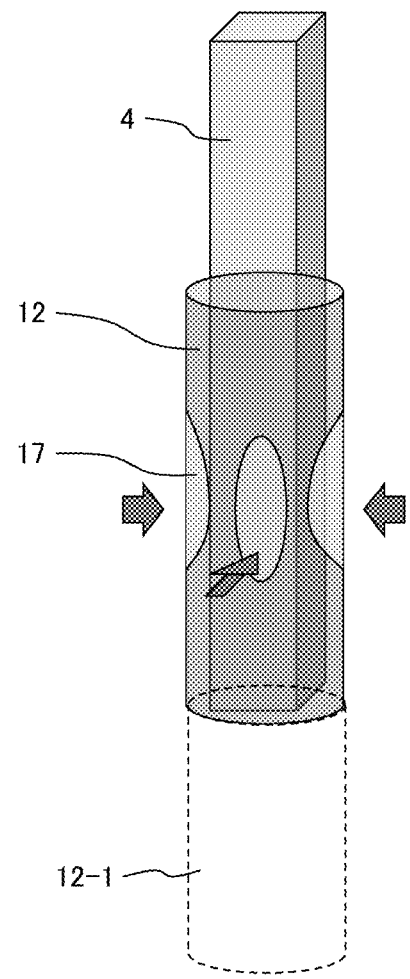

[FIG. 9C]
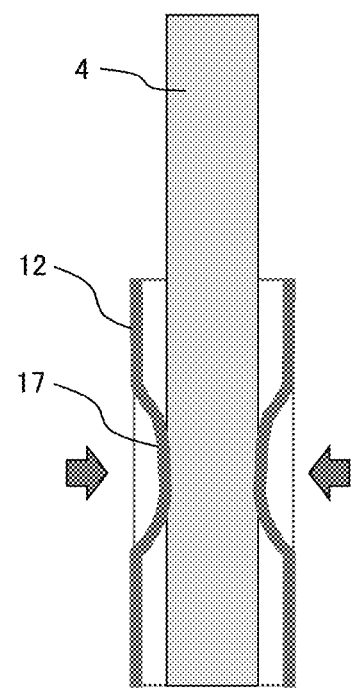

[FIG. 10]
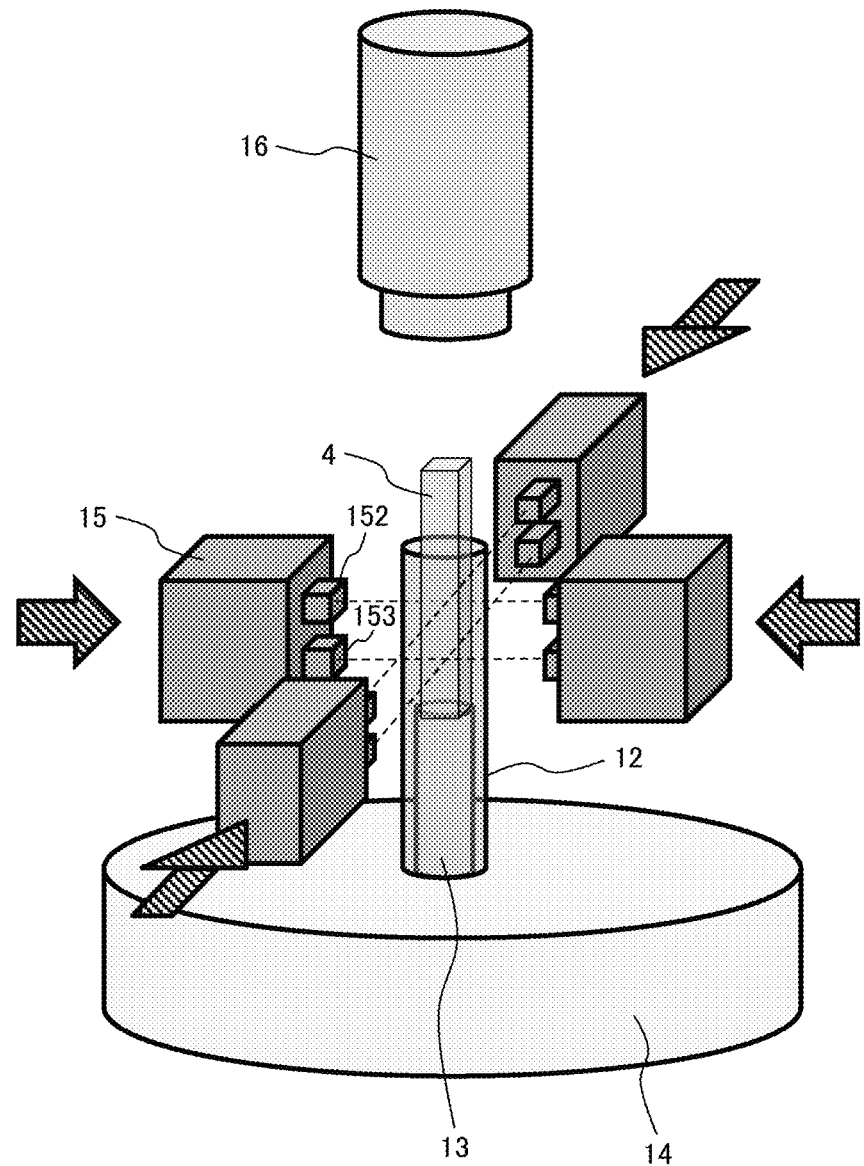

[FIG. 11A]
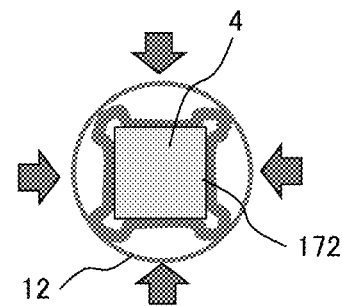
[FIG. 11B]
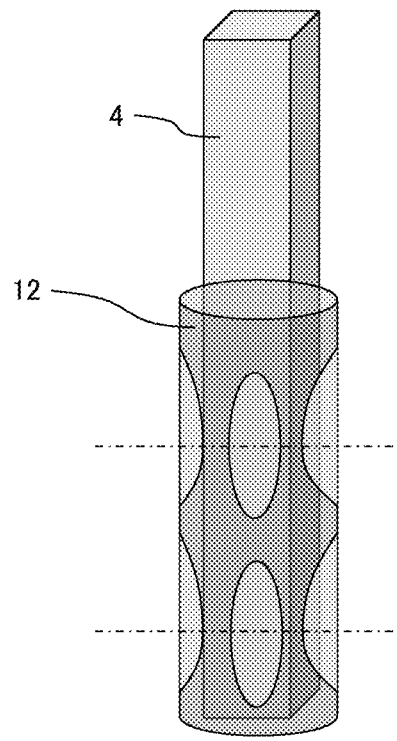

[FIG. 11C]
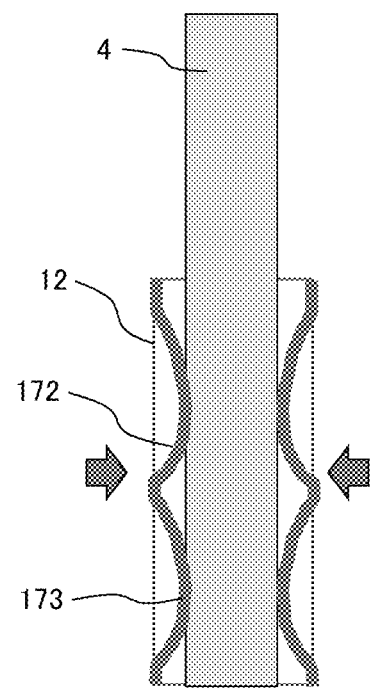

[FIG. 12]
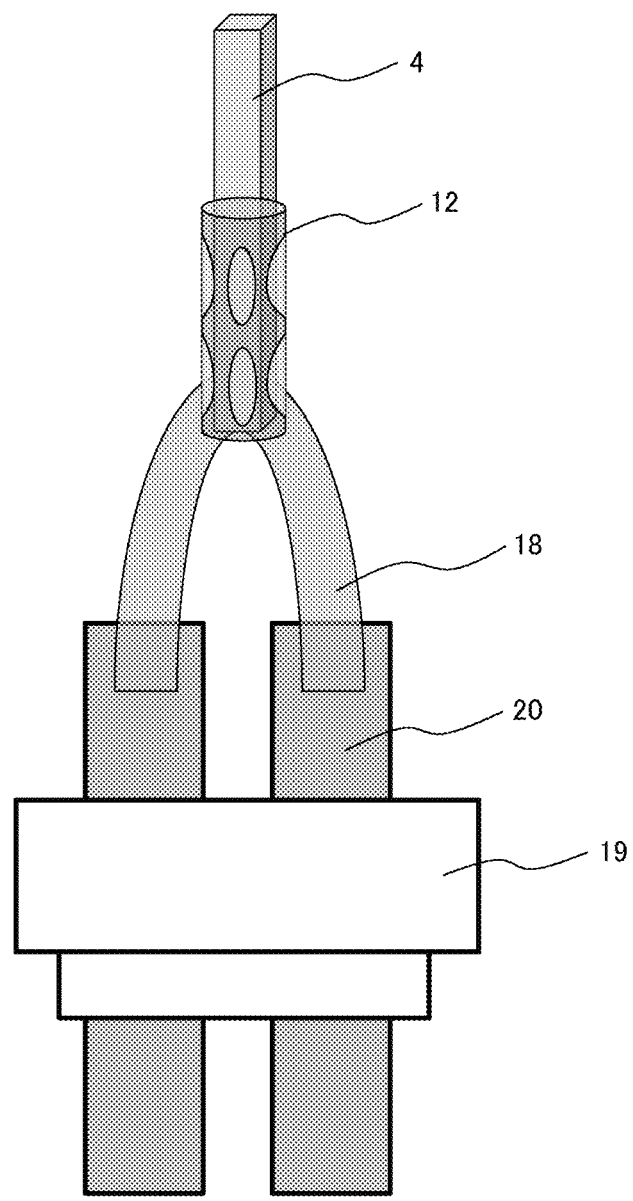

[FIG. 13A]
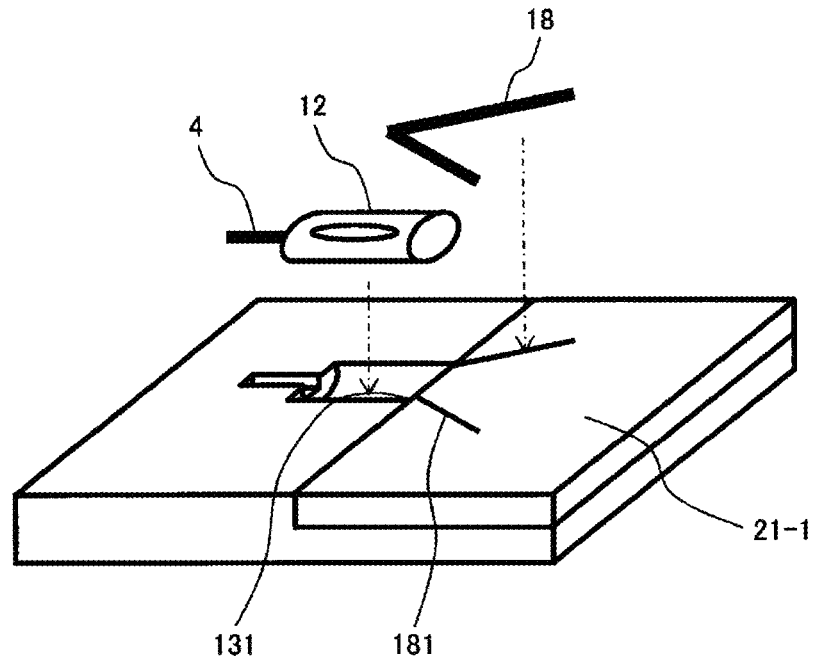
[FIG. 13B]
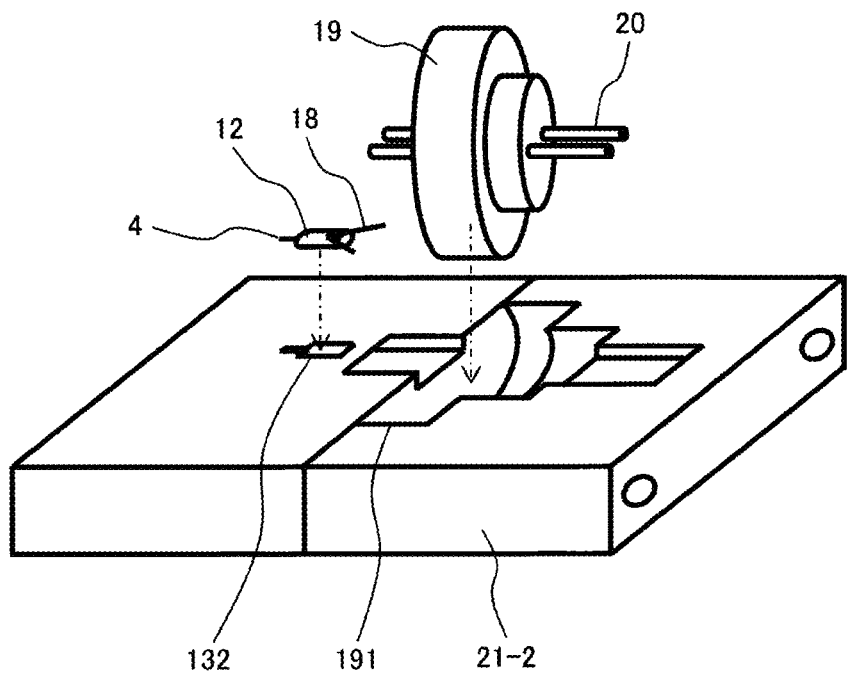

[FIG. 14A]
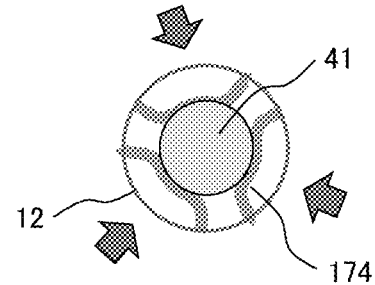
[FIG. 14B]
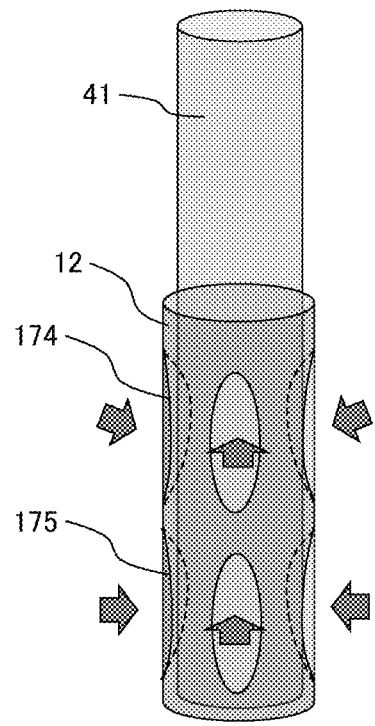

[FIG. 14C]
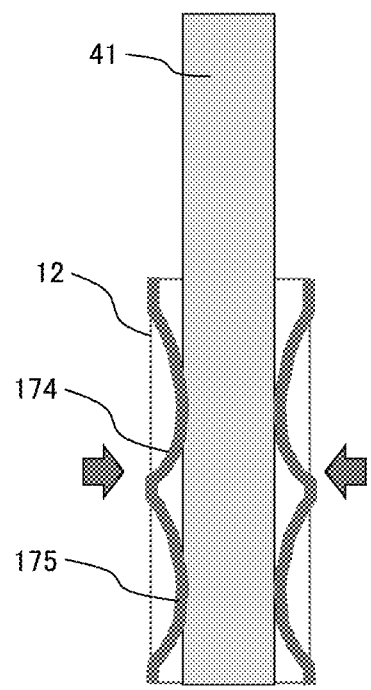
[FIG. 15]
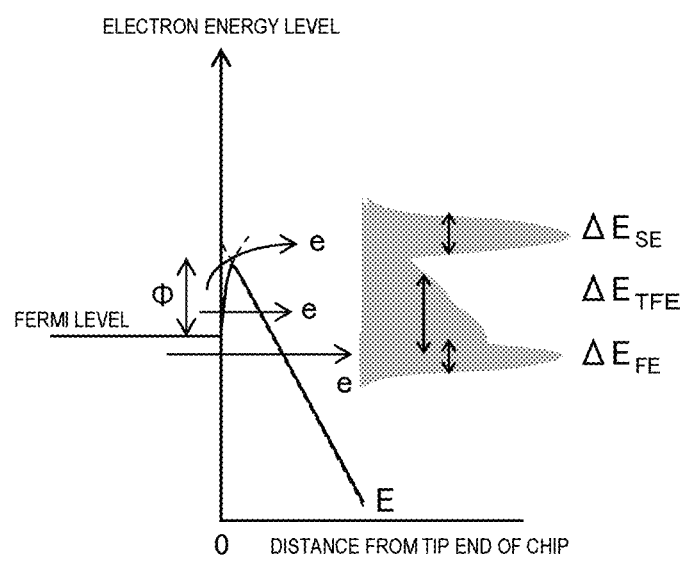

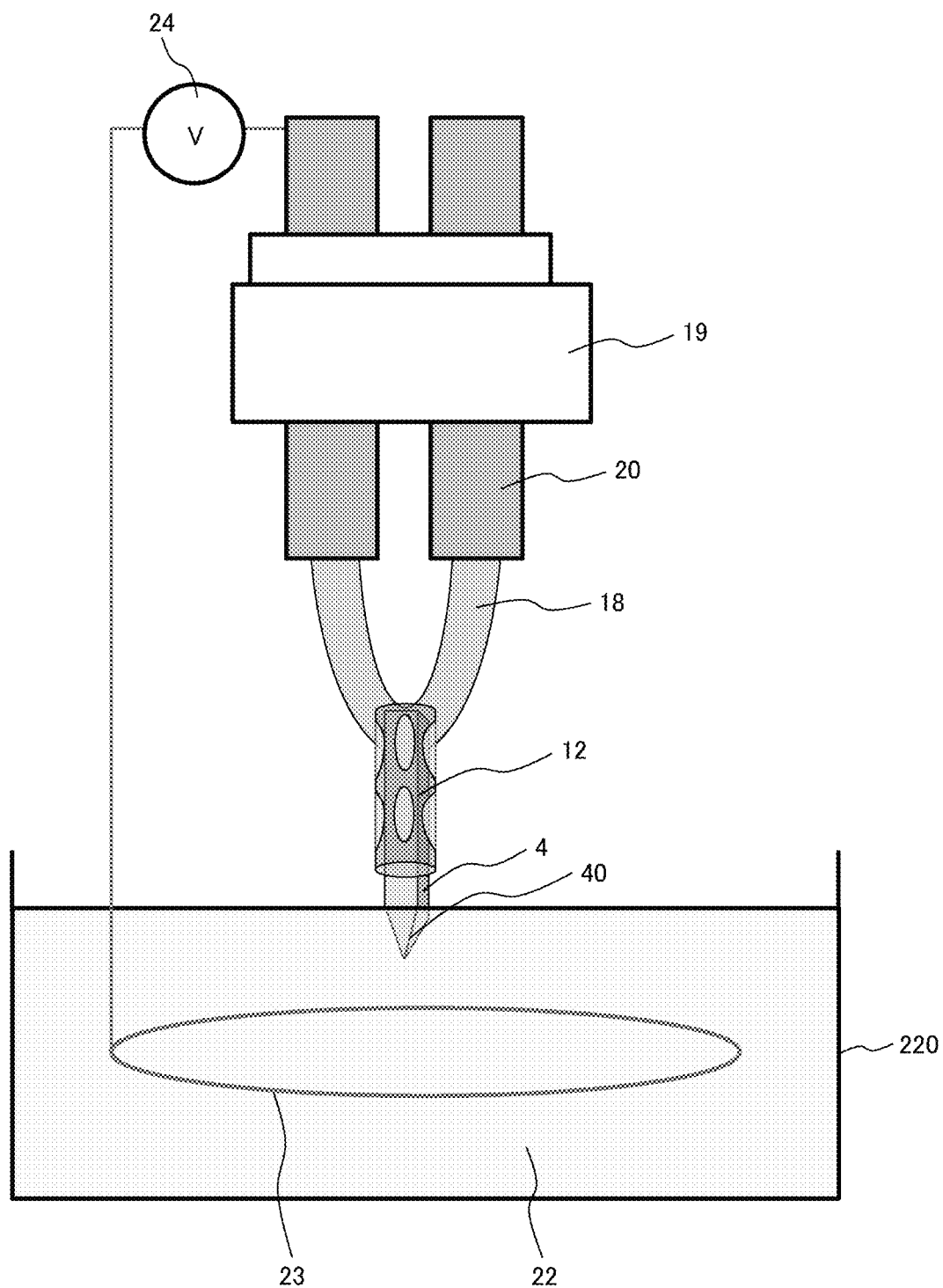
[FIG. 16]

[FIG. 17]
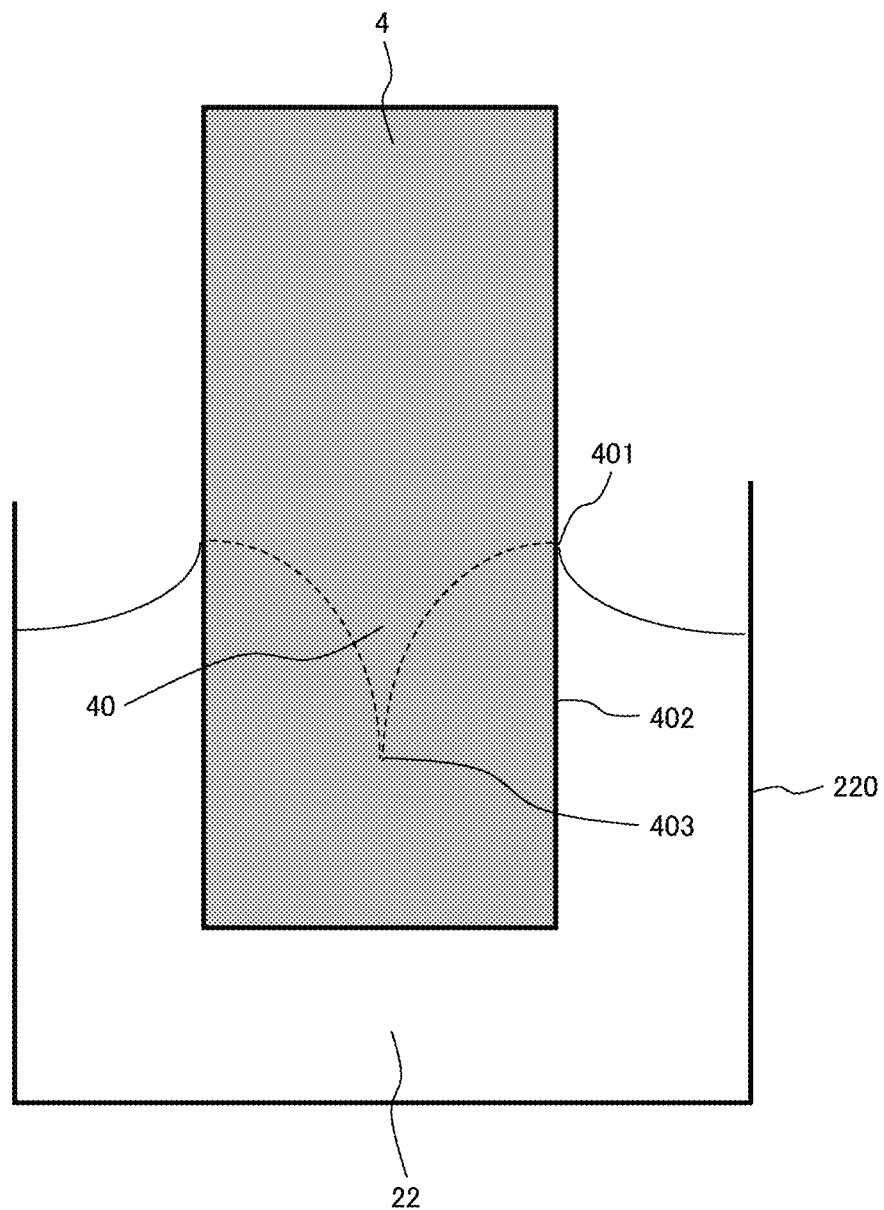

[FIG. 18]
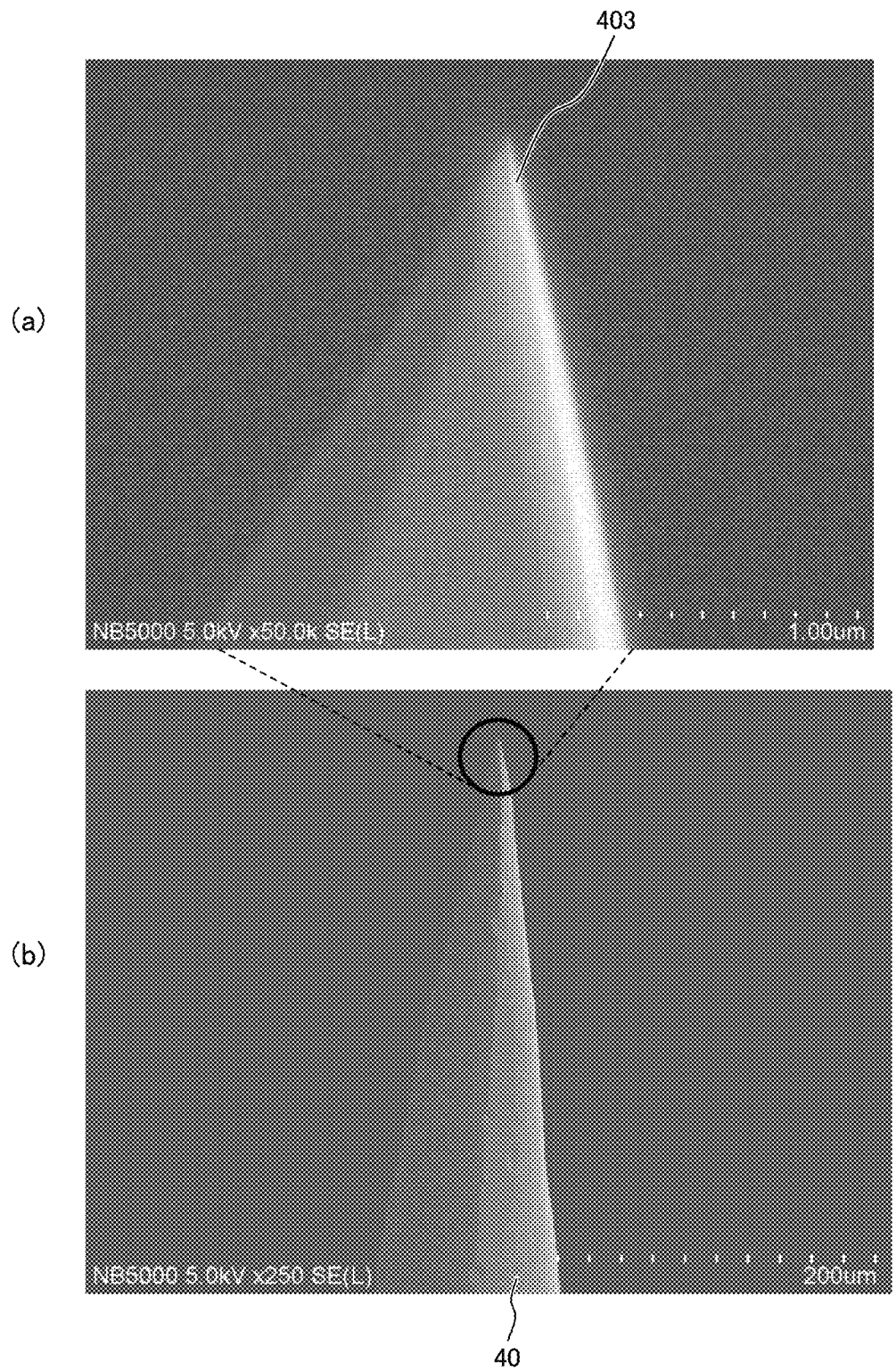

[FIG. 19]
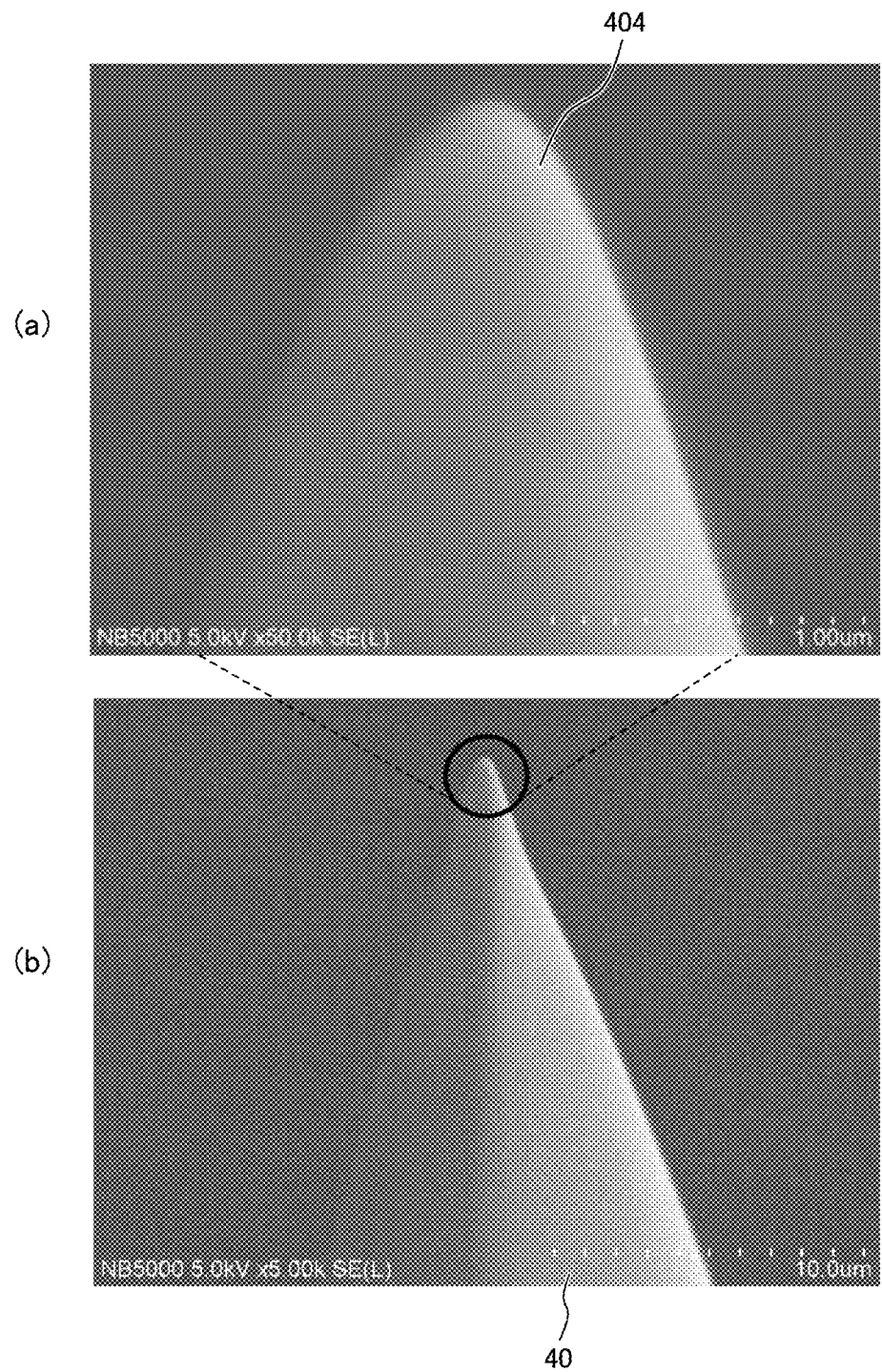

[FIG. 20]
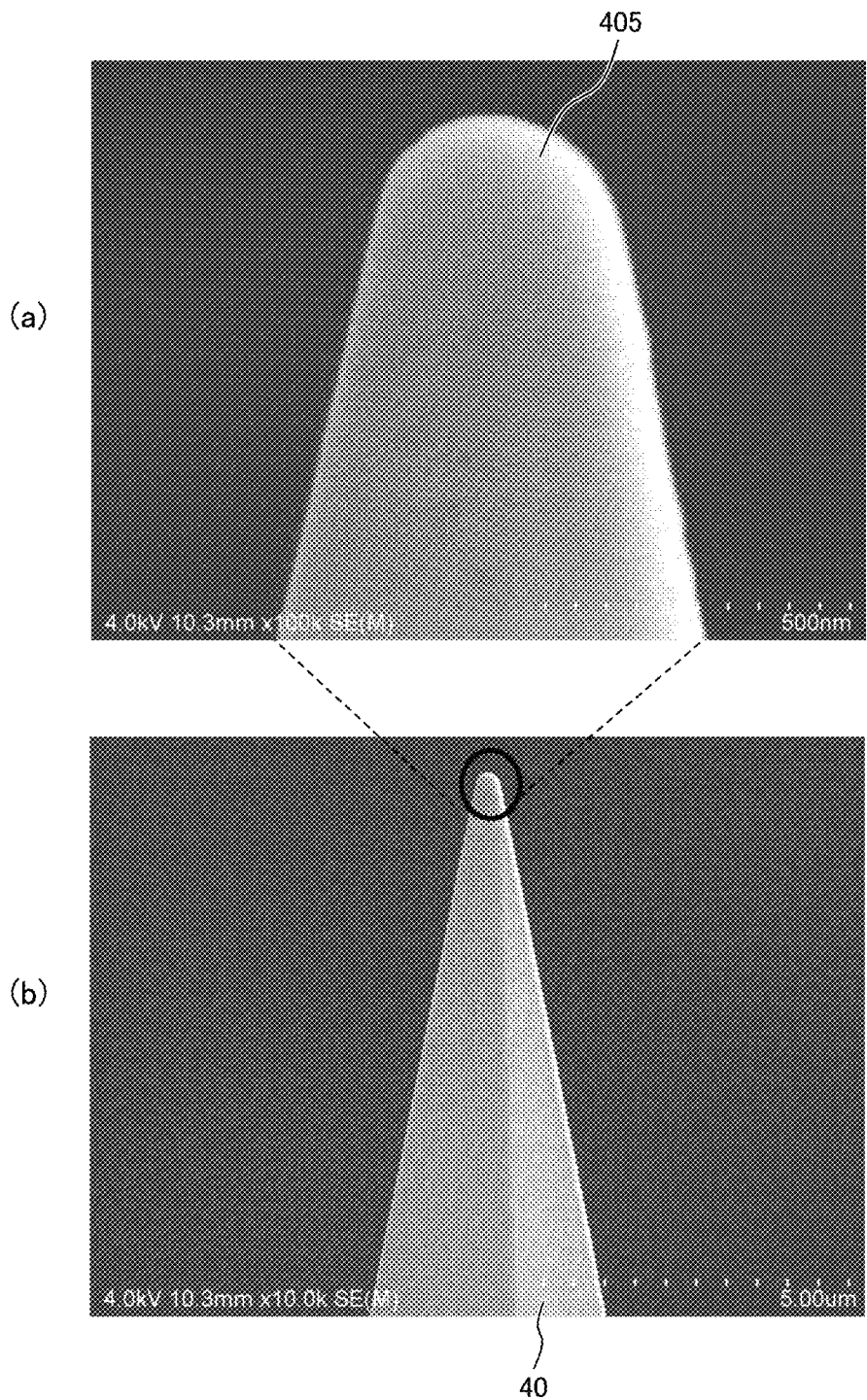

[FIG. 21]
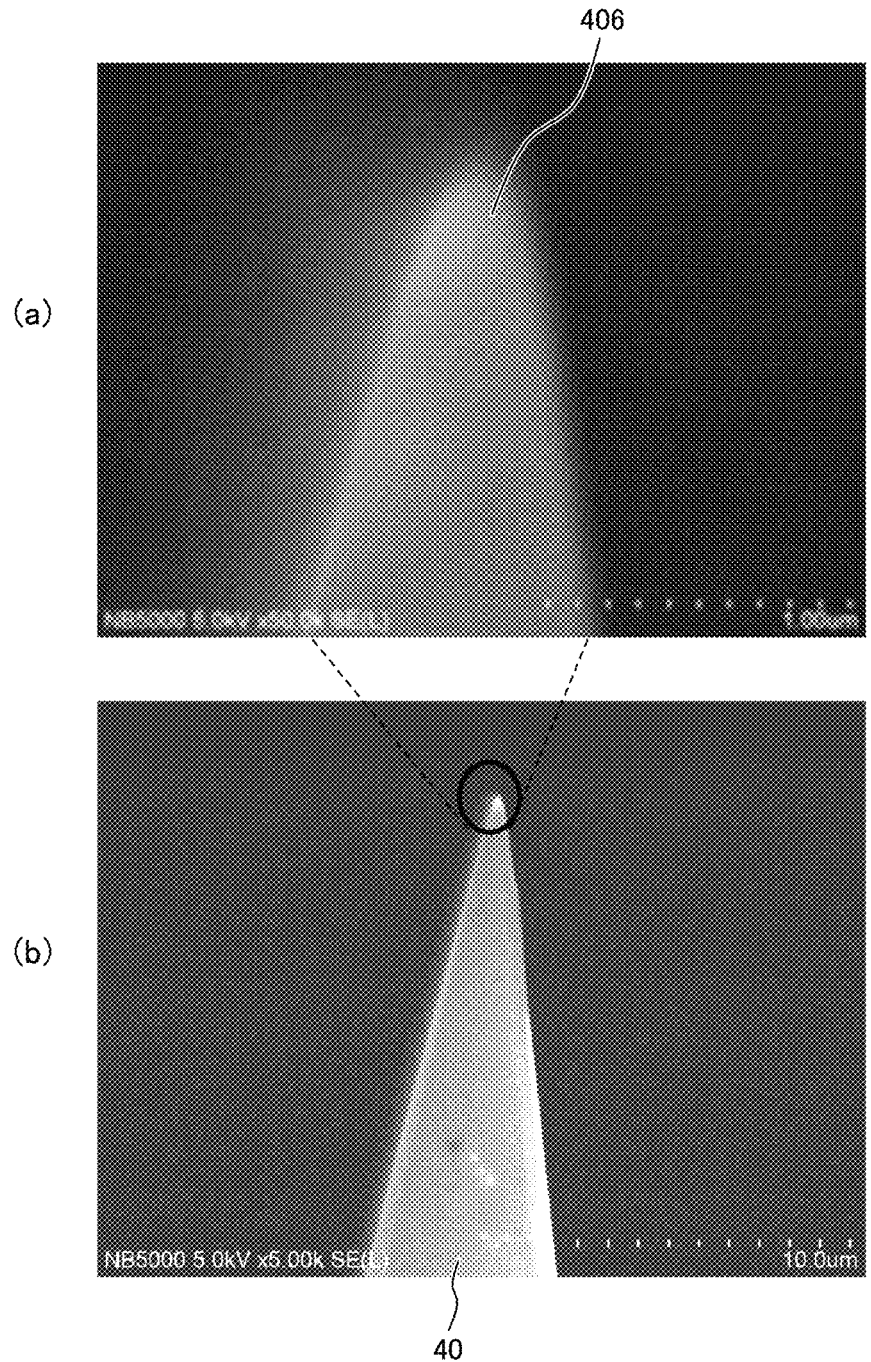

[FIG. 22]
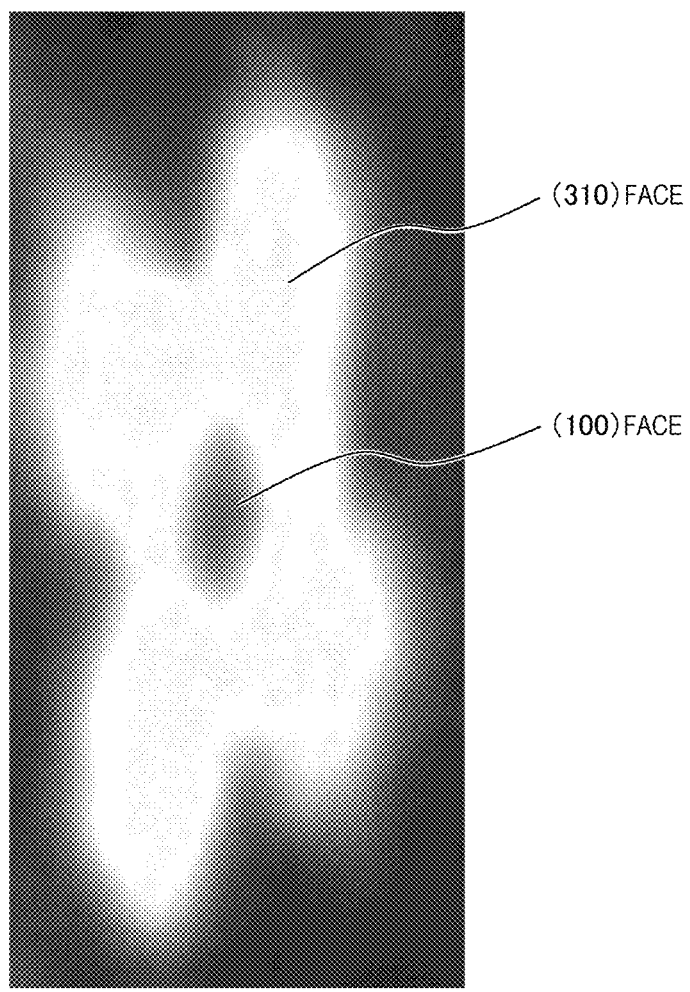

[FIG. 23]
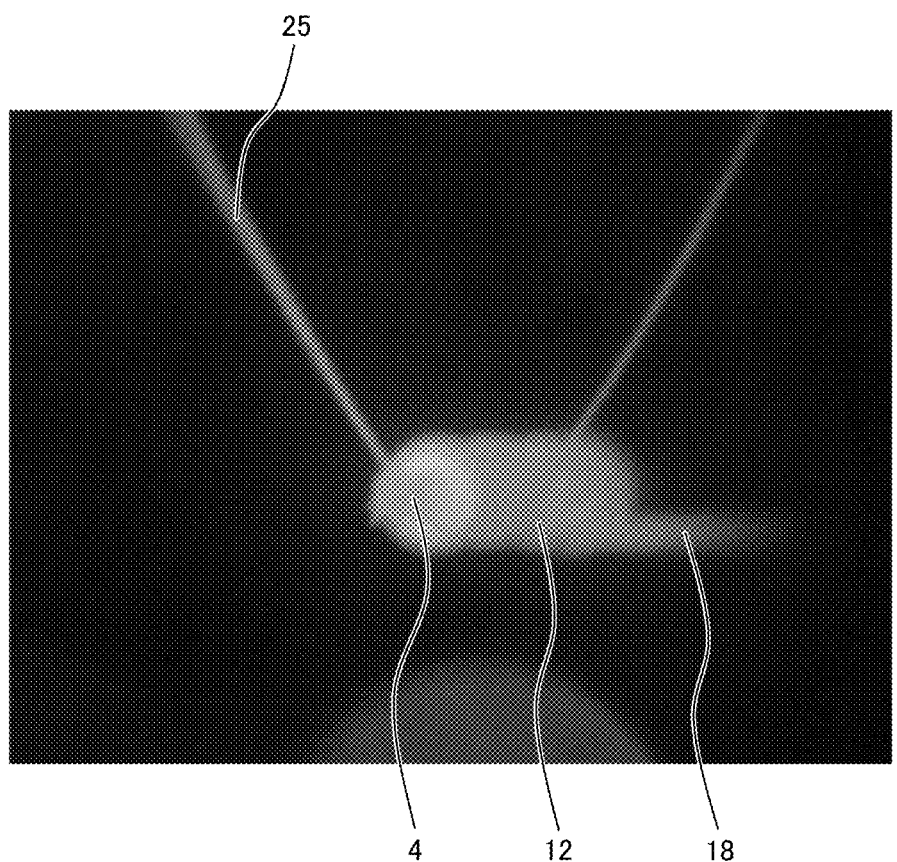

[FIG. 24]
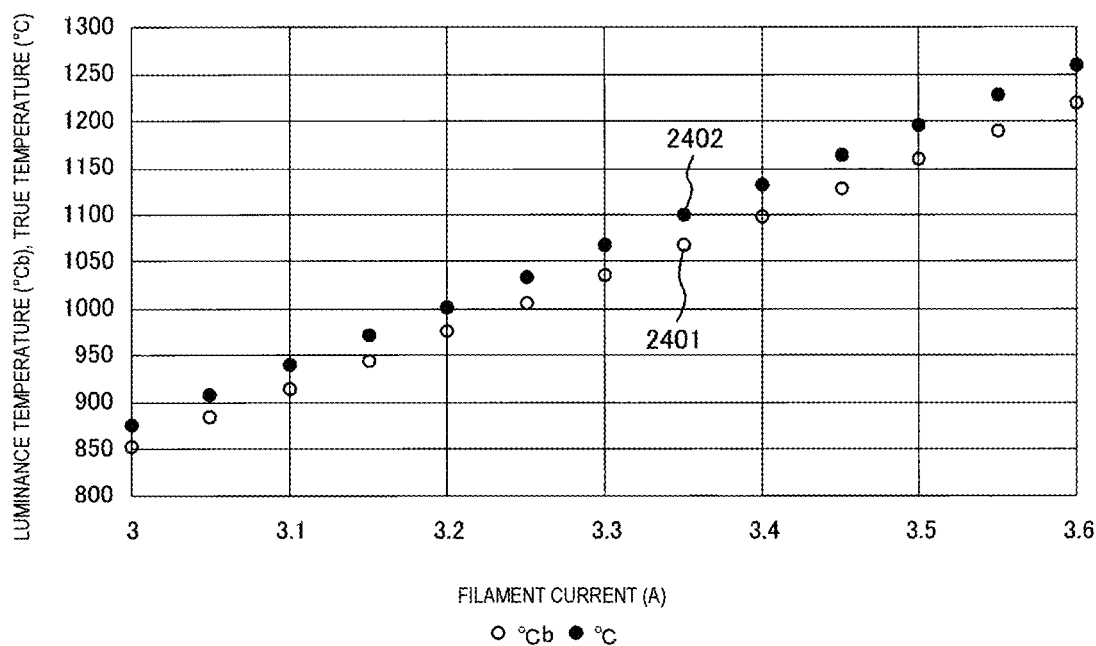
[FIG. 25]
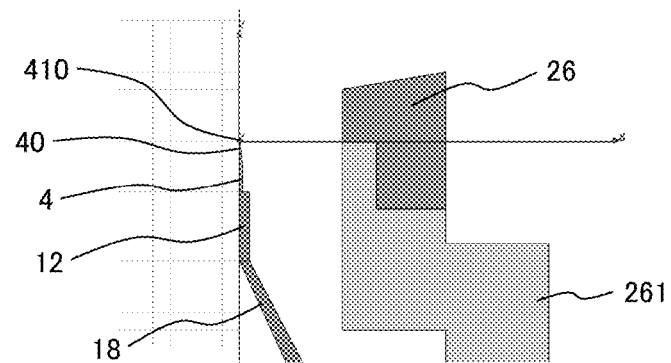

[FIG. 26]
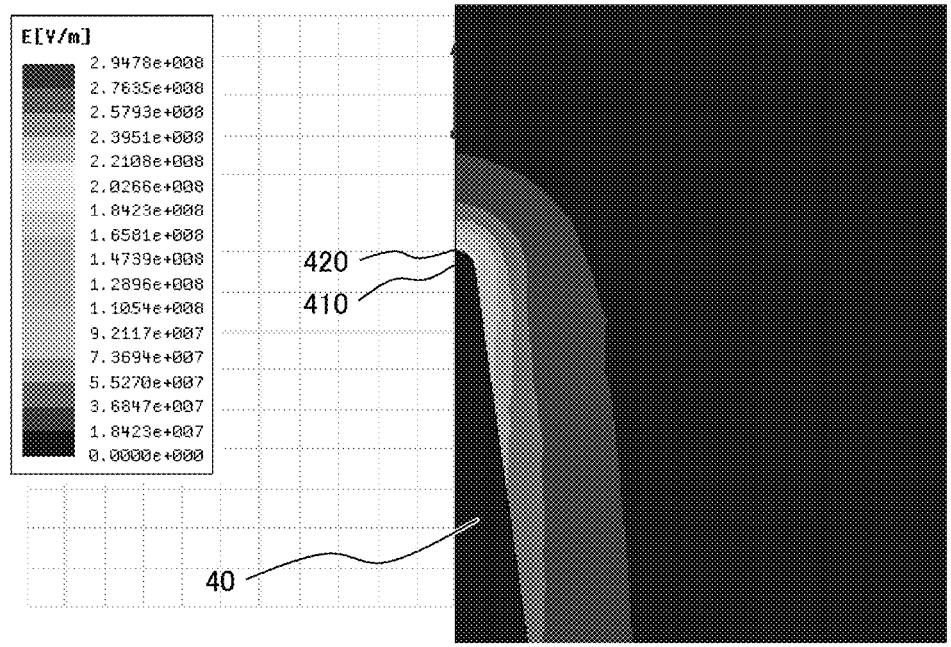
[FIG. 27]
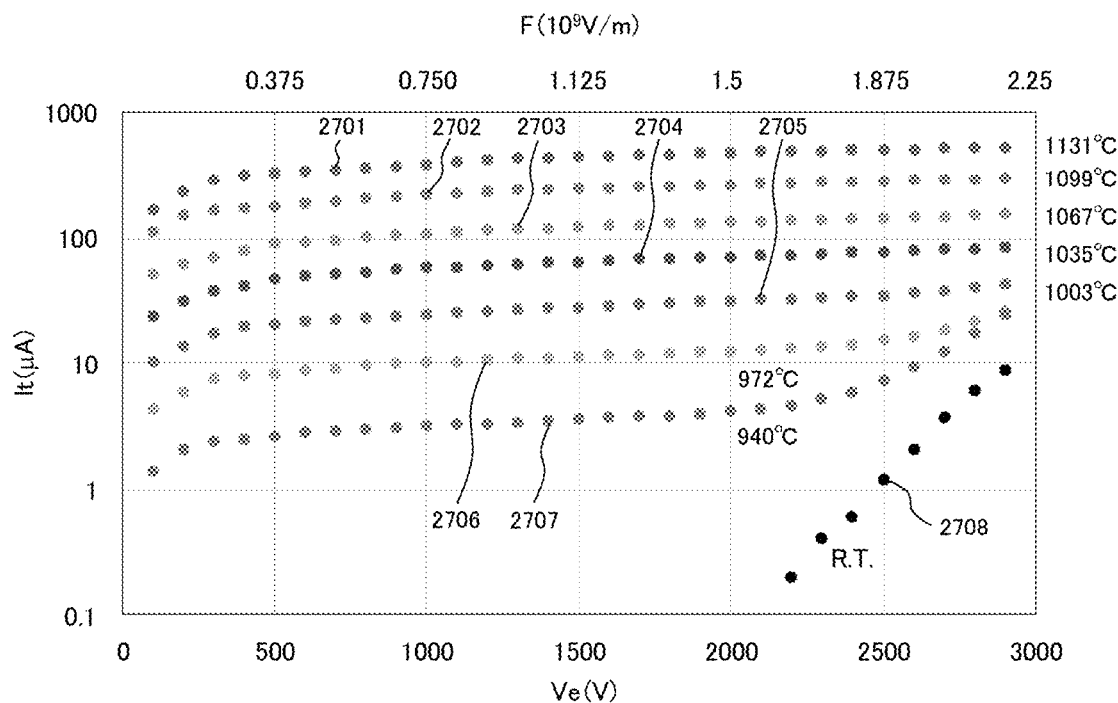

[FIG. 28]
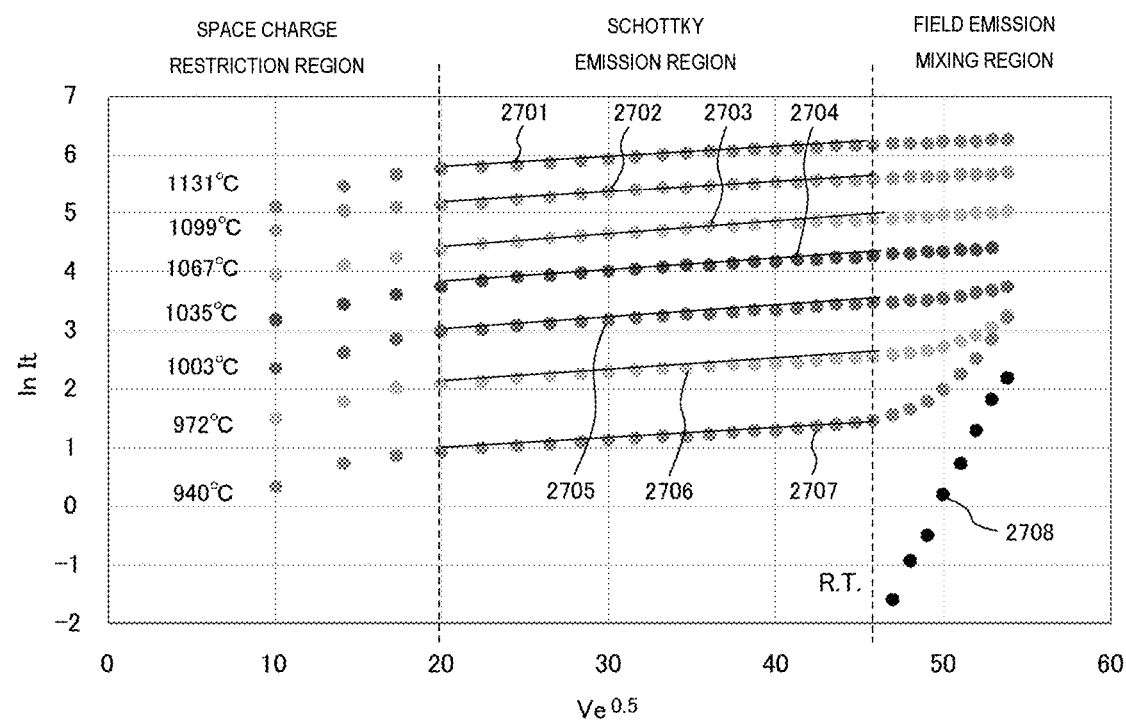

[FIG. 29]
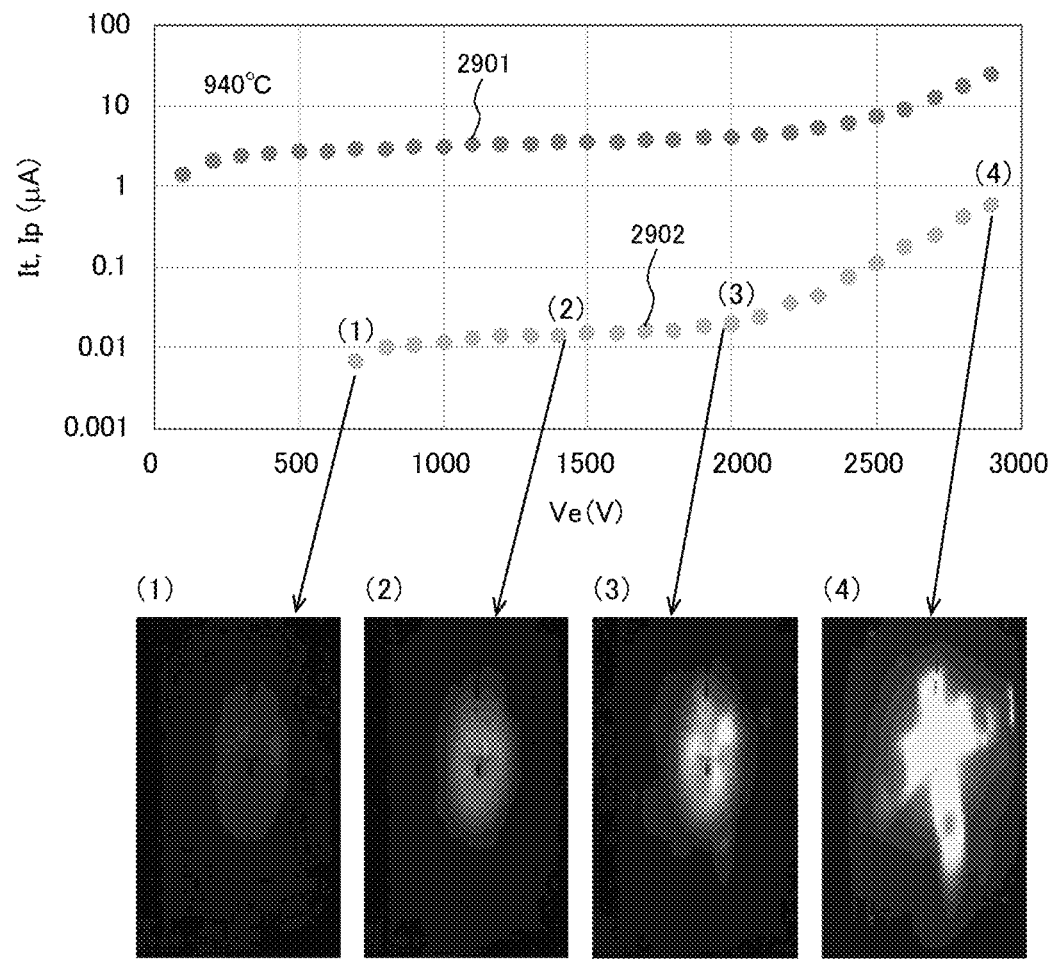

[FIG. 30]
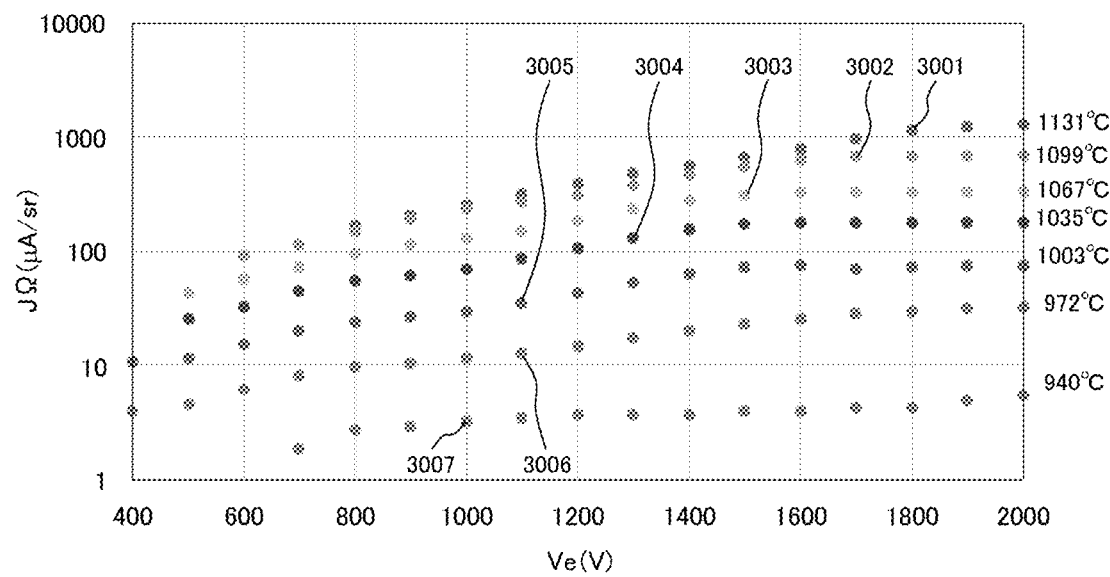
[FIG. 31]
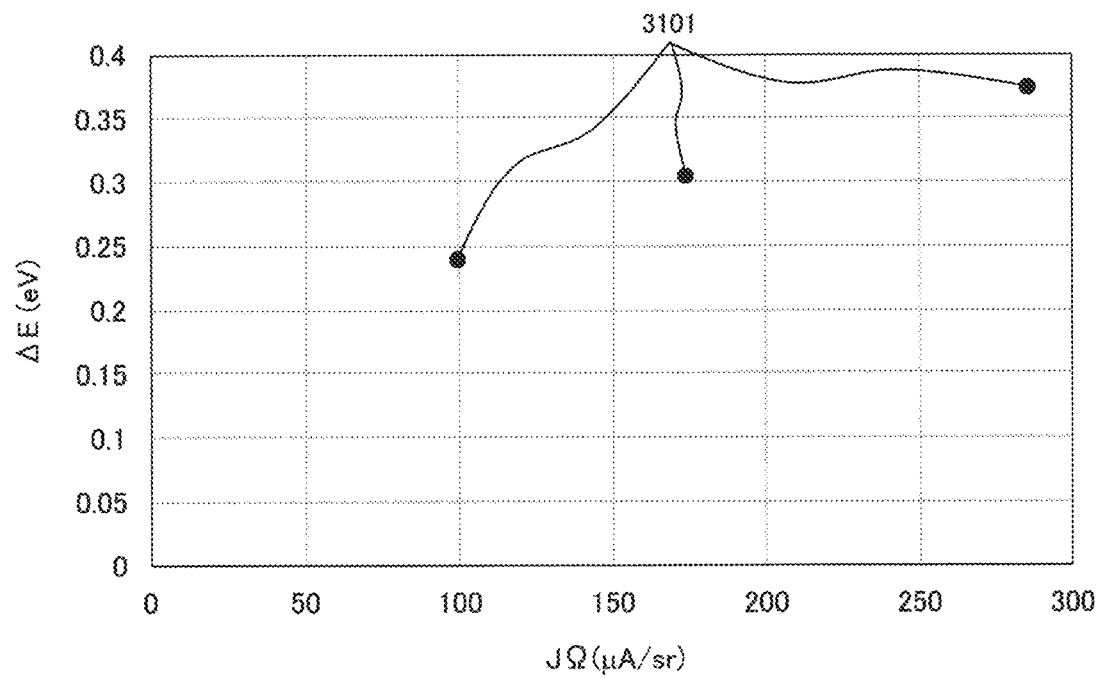

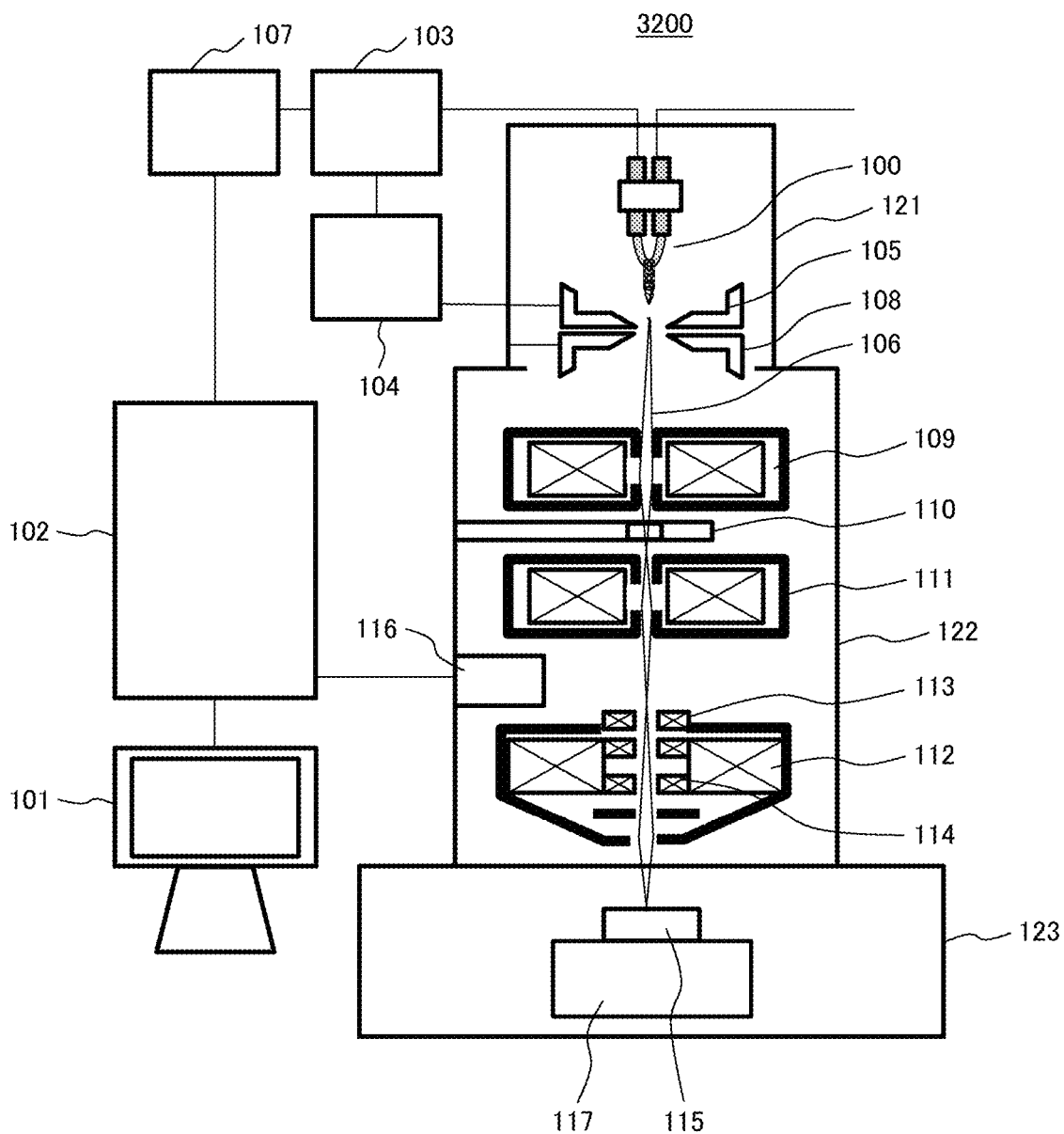
[FIG. 32]

ELECTRON SOURCE, METHOD FOR MANUFACTURING THE SAME, AND ELECTRON BEAM DEVICE USING THE SAME

TECHNICAL FIELD

The present invention relates to an electron source of an electron beam device such as an electron microscope, a method for manufacturing the electron source, and an electron beam device using the electron source.

BACKGROUND ART

Among electron microscopes, there is a scanning electron microscope (SEM) serving as a device capable of observing a surface of a sample in a simple manner.

Electron sources used in an electron beam device such as an electron microscope include a thermal emitter electron source (TE), a field emitter electron source (FE), and a Schottky emitter electron source (SE). FIGS. 1A to 1C are energy diagrams showing an operation principle of each electron source.

FIG. 1A is a graph showing an operation principle of the thermal emitter electron source (TE). The thermal emitter electron source heats a filament of tungsten (W) processed into a hairpin shape to approximately 2500° C., and causes electrons thermally excited in a W solid to cross an energy barrier having a work function $\varphi$ (4.3 eV to 4.5 eV), thereby taking electrons e out to a vacuum. Since the electron source is constantly heated, surface contamination of the electron source due to gas adsorption or the like does not occur, and a stable electron beam with little current fluctuation can be taken out. On the other hand, since the electron source is heated to a fairly high temperature, energy full width at half maximum $\Delta E_{TE}$ of emitted electrons is large at 3 eV to 4 eV, and since electrons are emitted from all heated portions, electron emission area is large and luminance B (unit area, an emitter current amount per unit solid angle) is low at approximately $10^5$ A/cm$^2$sr.

Therefore, a thermal emitter electron source of a hexaboride such as lanthanum hexaboride (LaB$_6$), which has a work function $\varphi$ of 2.6 eV and whose work function $\varphi$ is less than W, is also used. Since the LaB$_6$ thermal emitter electron source has a low work function $\varphi$, an operation temperature can be reduced to approximately 1400° C. to 1600° C., energy full width at half maximum $\Delta E_{TE}$ can be reduced to 2 eV to 3 eV, and luminance B can be increased to approximately $10^6$ A/cm$^2$sr. As the thermal emitter electron source, for example, an electron source obtained by emitting thermal electrons by heating a hexaboride is disclosed. Since the thermal emitter electron source has a relatively large energy full width at half maximum $\Delta E_{TE}$, when the thermal emitter electron source is used in an electron microscope, spatial resolution is low since chromatic aberration of an electron optical system such as an objective lens is large. However, since the thermal emitter electron source is easy to be handled, the thermal emitter electron source is used in an inexpensive and simple electron source for a scanning electron microscope, a transmission electron microscope that is less affected by chromatic aberration, or the like.

FIG. 1B is a graph showing an operation principle of the field emitter electron source (FE). Since the field emitter electron source (FE) can emit an electron beam with good monochromaticity and high luminance, chromatic aberration of an electron optical system can be reduced and the field emitter electron source is used as an electron source for a scanning electron microscope having high spatial resolution. A tungsten (W) chip having a sharpened tip end is widely used as the field emitter electron source. A high electric field is applied by concentrating an external electric field F at the tip end of the W chip, and the electrons e in the W chip quantum-mechanically permeate an energy barrier that is effectively thinned, and are emitted to a vacuum.

Since the field emitter electron source (FE) can be operated at a room temperature, energy full width at half maximum $\Delta E_{FE}$ of the extracted electrons e is small at approximately 0.3 eV, and since electrons are emitted from a small electron emission area at a tip end of a fairly sharp chip, luminance is high at $10^8$ A/cm$^2$sr. Since the field emitter electron source has small energy full width at half maximum $\Delta E$ and high luminance B, a field emitter electron source using a hexaboride nanowire, such as LaB$_6$, having a small work function $\varphi$ is also proposed (for example, PTL 1). Since LaB$_6$ has a lower work function barrier than W, it is possible to transmit electrons at a smaller electric field, emit an electric field, and further reduce energy full width at half maximum $\Delta E_{TE}$.

PTL 2 provides a field emitter electron source using a hexaboride single crystal having stable electron emission characteristics. The field emitter electron source is configured such that a chip work piece is cut out from a single crystal body of a hexaboride grown by melt growth, a tip end of the chip work piece in a longitudinal direction is sharpened and cleaned to form a crystal terrace perpendicular to a crystal axis at the tip end.

FIG. 1C is a graph showing an operation principle of the Schottky emitter electron source (SE). A Schottky emitter electron source of ZrO/W in which zirconium oxide (ZrO$_2$) is applied to a W chip and diffused to a (100) crystal face of W is used in length measurement scanning electron microscope that performs, for example, a dimension measurement of a semiconductor device. The ZrO/W Schottky emitter electron source is constantly heated to approximately 1400° C. to 1500° C., ZrO$_2$ thermally diffused to a tip end of the W chip reduces a work function $\varphi$ of a (100) face of the W chip to approximately 2.8 eV, and ZrO$_2$ crosses an energy barrier whose work function $\varphi$ is reduced due to a Schottky effect caused by an external electric field F applied to the tip end of the chip and a mirror image potential, so that thermal electrons are emitted. Although the Schottky emitter electron source can stably extract higher current density than the field emitter electron source, energy full width at half maximum $\Delta E_{SE}$ is large at approximately 0.6 eV to 1 eV since an operation temperature is high.

On the other hand, so far, inventors have developed (PTL 3 discloses) a cold field emitter electron source (CFE) in which a hexaboride single crystal such as hexagonal cerium (CeB$_6$) prepared by a floating zone method or the like is used, a radius of curvature of a tip end of the hexaboride single crystal is processed to approximately 50 nm to 150 nm or 300 nm to 500 nm by making full use of electropolishing, focused ion beam processing (FIB), electric field evaporation, and the like on the tip end, and further, a heating processing such as flushing and annealing is performed in a vacuum at 1000° C. to 1400° C. for approximately 5 seconds to 10 minutes, so that a (310) crystal face of CeB$_6$ having a low work function is formed, and an electric field is emitted at a room temperature.

The cold field emitter electron source (CFE) has good monochromaticity as compared with the field emitter electron source of the W chip in the related art, and as compared with W, it is possible to achieve a field emitter electron source having a small energy full width at half maximum $\Delta E_{FE}$ at 0.08 eV to 0.14 eV at the same radiation angle current density and high radiation angle current density in which a ratio $J\Omega/It$ of radiation angle current density $J\Omega$ (µA/sr) to a total current It is 6 or more. According to this invention, chromatic aberration of a scanning electron microscope particularly at a low acceleration voltage can be improved, and observation of a polar surface of a sample or observation of a light element substance such as a carbon-based compound can be performed with high spatial resolution.

CITATION LIST

Patent Literature

PTL 1: WO2014/007121
PTL 2: WO2016/167048
PTL 3: WO2018/07001

SUMMARY OF INVENTION

Technical Problem

PTL 1 discloses a cold field emitter (cold field emitter electron source (CFE)) using a hexaboride nanowire, but does not disclose an application to a Schottky emitter electron source (SE).

PTL 2 discloses a field emitter electron source (FE) using a hexaboride single crystal, but does not disclose an application to a Schottky emitter electron source (SE).

Further, the cold field emitter electron source (CFE) disclosed in PTL 3 has good monochromaticity of emitted electrons, and can reduce chromatic aberration of an electron optical system such as an objective lens, so that the cold field emitter electron source can be applied to a scanning electron microscope having high spatial resolution. However, since the cold field emitter electron source is basically operated at a room temperature, there are problems that gases or the like remained in an electron beam device is likely to be adsorbed on an electron emission face and stability of an emitter current is poor. Therefore, the cold field emitter electron source is not suitable for an electron source of a scanning electron microscope for an application such as length measurement of a semiconductor device requiring long-term stability unless using a special method such as prevention of gas adsorption such as regular heating. Maximum taken out radiation angle current density $J\Omega$ is approximately 100 µA/sr, and the cold field emitter electron source is not suitable for an application, such as composition analysis at a large area and length measurement of a semiconductor device, which requires high current density of several 100 µA/sr to 1000 µA/sr.

On the other hand, although the Schottky emitter electron source (SE) of ZrO/W can stably take out higher current density for a long period of time than the W field emitter electron source as described above, there are problems that the energy full width at half maximum $\Delta E_{SE}$ is large at approximately 0.6 eV to 1 eV since an operation temperature is high, and spatial resolution is poor since chromatic aberration of an electron optical system is large.

An object of the invention is to provide a novel electron source having good monochromaticity, long-term stability of an emitter current, and high current density, a method for manufacturing the electron source, and further an electron beam device applicable to an application requiring long-term stability, high current density, and high resolution.

Solution to Problem

In order to solve the problems described above, the invention provides a Schottky emitter electron source. The Schottky emitter electron source includes a columnar chip of a hexaboride single crystal, a metal pipe that holds the columnar chip of the hexaboride single crystal, a filament connected to the metal pipe at a central portion, and a stem provided with a pair of electrodes respectively connected to end portions at two sides of the filament. The columnar chip of the hexaboride single crystal is formed into a cone shape at a portion of the columnar chip closer to a tip than a portion of the columnar chip held in the metal pipe. A tip end portion of the columnar chip having a cone shape has a (310) crystal face.

In order to solve the problems described above, the invention provides a method for manufacturing an electron source. The method includes forming a columnar chip by cutting out a hexaboride single crystal from a longitudinal direction and along a [310] orientation; fixing the columnar chip to a metal pipe by inserting a part of the columnar chip into the metal pipe; performing diameter reduction by electropolishing to form a cone shape around a tip end portion of a portion where the columnar chip fixed to the metal pipe protrudes from the metal pipe; processing the tip end portion of the portion where a diameter of the columnar chip is reduced to form a cone shape to form a substantially hemispherical shape by electropolishing, electric field evaporation, or ion beam processing; fixing, to a central portion of a filament, the metal pipe to which the columnar chip is fixed, the tip end portion of the portion where a diameter of the columnar chip is reduced to form a cone shape being processed to have a hemispherical shape; and respectively connecting end portions at two sides of the filament to which the metal pipe is fixed and a pair of electrodes fixed to a stem.

In order to solve the problems described above, the invention provides an electron beam device. The electron beam device includes an electron source, a sample stage on which a sample is placed, an extraction electrode that extracts electrons from the electron source, an acceleration electrode that accelerates the electrons extracted by the extraction electrode, a lens system including an objective lens that focuses the electrons accelerated by the acceleration electrode, a deflection scanning unit that scans and irradiates the sample placed on the sample stage with the electrons focused by the lens system including the objective lens, and a secondary electron detection unit that detects secondary electrons generated from the sample scanned and irradiated with the electrons by the deflection scanning unit. The electron source includes a columnar chip of a hexaboride single crystal, a metal pipe that holds the columnar chip of the hexaboride single crystal, a filament connected to the metal pipe at a central portion, and a stem provided with a pair of electrodes respectively connected to end portions at two sides of the filament. The columnar chip of the hexaboride single crystal is formed into a cone shape at a portion closer to a tip than a portion held in the metal pipe. A tip end portion of the columnar chip having a cone shape has a (310) crystal face. Schottky electrons are emitted from the (310) crystal face.

Advantageous Effect

According to the invention, a novel electron source having good monochromaticity, long-term stability of an emitter current, and high current density can be provided, and an electron beam device applicable to an application requiring long-term stability, high current density, and high resolution can be provided.

BRIEF DESCRIPTION OF DRAWINGS

FIG. 1A is an energy diagram showing an operation principle of a thermal emitter electron source used in an electron beam device such as an electron microscope.

FIG. 1B is an energy diagram showing an operation principle of a field emitter electron source used in an electron beam device such as an electron microscope.

FIG. 1C is an energy diagram showing an operation principle of a Schottky emitter electron source used in an electron beam device such as an electron microscope.

FIG. 2 is a perspective view showing a crystal structure (unit cell) of a hexaboride single crystal used in an electron source according to a first embodiment.

FIG. 3 is a perspective view showing an atomic structure of a (310) face of the hexaboride single crystal used in the electron source according to the first embodiment.

FIG. 4 is a schematic view showing a hexaboride single crystal grown along a [100] crystal axis and a quadrangular columnar chip cut out from the hexaboride single crystal along a [310] crystal axis according to the first embodiment.

FIG. 5 is a schematic view showing a hexaboride single crystal grown along a [310] crystal axis and a quadrangular columnar chip cut out from the hexaboride single crystal along the [310] crystal axis according to the first embodiment.

FIG. 6 is a process flow chart showing a method for manufacturing a metal pipe according to the first embodiment.

FIG. 7 is a view showing an assembled state of a hexaboride chip according to the first embodiment, and is a perspective view showing a pedestal, the metal pipe, and the hexaboride chip in a state in which the metal pipe is inserted into a guide pin standing vertically on the pedestal, the hexaboride chip is inserted into the metal pipe, and a tip end portion of the hexaboride chip is out of the metal pipe by a height P.

FIG. 8 is a view showing a process of press-contacting the metal pipe with the hexaboride chip according to the first embodiment, and is a perspective view showing a state of arranging a press-contact tool that presses against the metal pipe from four directions in a state in which the hexaboride chip is inserted into the metal pipe on the pedestal.

FIG. 9A is a view showing a state in which the metal pipe is press-contacted with the hexaboride chip according to the first embodiment, and is a cross-sectional view showing press-contacted portions as viewed from above.

FIG. 9B is a view showing a state in which the metal pipe is press-contacted with the hexaboride chip according to the first embodiment, and is a perspective view showing the press-contacted portions.

FIG. 9C is a view showing a state in which the metal pipe is press-contacted with the hexaboride chip according to the first embodiment, and is a front cross-sectional view showing the press-contacted portions.

FIG. 10 is a view showing a process of press-contacting the metal pipe with the hexaboride chip according to a modification of the first embodiment, and is a perspective view showing a state of arranging a press-contact tool that presses against the metal pipe from four directions at two different positions in an upper-lower manner along an axis direction in a state in which the hexaboride chip is inserted into the metal pipe on the pedestal.

FIG. 11A is a view showing a state in which the metal pipe is press-contacted with the hexaboride chip at two different positions in an upper-lower manner along the axis direction according to the modification of the first embodiment, and is a cross-sectional view showing press-contacted portions as viewed from above.

FIG. 11B is a view showing a state in which the metal pipe is press-contacted with the hexaboride chip at two different positions in an upper-lower manner along the axis direction according to the modification of the first embodiment, and is a perspective view showing the press-contacted portions.

FIG. 11C is a view showing a state in which the metal pipe is press-contacted with the hexaboride chip at two different positions in an upper-lower manner along the axis direction according to the modification of the first embodiment, and is a front cross-sectional view showing the press-contacted portions.

FIG. 12 is a view showing a structure of the electron source according to the first embodiment, and is a plan view showing a state in which the metal pipe that is press-contacted with the hexaboride chip and the filament are spot-welded, and the filament and electrodes of a stem are spot-welded.

FIG. 13A is a view showing a position alignment jig during assembling of the electron source according to the first embodiment, and is a perspective view showing a relation among the metal pipe press-contacted with the hexaboride chip, the filament, and the position alignment jig.

FIG. 13B is a view showing the position alignment jig during assembling of the electron source according to the first embodiment, and is a perspective view showing a relation among the metal pipe and the filament that are spot-welded, the stem, and the position alignment jig.

FIG. 14A is a view showing a state in which the metal pipe is press-contacted with a hexaboride chip formed into a cylindrical shape from three directions at two different positions in an upper-lower manner along an axis direction according to another modification of the first embodiment, and is a cross-sectional view showing press-contacted portions as viewed from above.

FIG. 14B is a view showing a state in which the metal pipe is press-contacted with the hexaboride chip formed into a cylindrical shape from three directions at two different positions in an upper-lower manner along the axis direction according to the another modification of the first embodiment, and is a perspective view showing the press-contacted portions.

FIG. 14C is a view showing a state in which the metal pipe is press-contacted with the hexaboride chip formed into a cylindrical shape from three directions at two different positions in an upper-lower manner along the axis direction according to the another modification of the first embodiment, and is a front cross-sectional view showing the press-contacted portions.

FIG. 15 is an energy diagram showing energy full width at half maximum of the electron source in a state in which a tip end of the hexaboride chip is sharpened.

FIG. 16 is a front view showing the electron source and an electropolishing liquid tank and showing a process of sharpening the tip end of the chip of the electron source by electropolishing according to the first embodiment.

FIG. 17 is a front view showing the tip end of the chip of the electron source and the electropolishing liquid tank and showing a principle of electropolishing the tip end of the chip of the electron source according to the first embodiment.

FIG. 18 is SEM images showing a state in which a tip end portion of the chip of the electron source is electropolished according to the first embodiment.

FIG. 19 is SEM images showing a result of processing the tip end of the chip of the electron source to form a substantially hemispherical shape by electropolishing the tip end of the chip again according to the first embodiment.

FIG. 20 is SEM images showing a result of processing the tip end of the chip of the electron source to form a substantially hemispherical shape by electric field evaporation after the tip end of the chip is electropolished according to the first embodiment.

FIG. 21 is SEM images showing a result of processing the tip end of the chip of the electron source to form a substantially hemispherical shape by focused ion beam after the tip end of the chip is electropolished according to the first embodiment.

FIG. 22 is an electric field emission microscope image of an electron emission face imaged in a state in which an electron emission face of a chip of the hexaboride electron source is surface-activated according to the first embodiment.

FIG. 23 is an image of a chip of a hexaboride electron source in a state in which the chip of the hexaboride electron source is heated according to a second embodiment.

FIG. 24 is a graph showing a relation between a filament current and a heating temperature of a chip of a $CeB_6$ electron source according to the second embodiment.

FIG. 25 is a plan view showing a positional relation between an extraction electrode of an evaluation device and the chip according to the second embodiment.

FIG. 26 is an electric field intensity distribution map showing a simulation example of electric field intensity applied to a tip end of the chip by the evaluation device according to the second embodiment.

FIG. 27 is a graph showing a voltage (electric field intensity) to current characteristic of an extraction voltage Ve (extraction electric field F) and a total current It of the $CeB_6$ electron source according to the second embodiment.

FIG. 28 is a graph showing a Schottky plot of the extraction voltage Ve and the total current It of the $CeB_6$ electron source according to the second embodiment.

FIG. 29 is a graph showing a voltage (electric field intensity) to current characteristic at 940° C. of the extraction voltage Ve, the total current It, and a probe current Ip of the $CeB_6$ electron source according to the second embodiment, and showing electric field radiation microscope images captured when voltages are applied.

FIG. 30 is a graph showing a relation between the extraction voltage Ve and radiation angle current density JΩ of the $CeB_6$ electron source according to the second embodiment.

FIG. 31 is a graph showing a relation between the radiation angle current density JΩ and energy full width at half maximum ΔE of the $CeB_6$ electron source according to the second embodiment.

FIG. 32 is a cross-sectional view showing a schematic configuration of an electron beam device (a scanning electron microscope mounted with a hexaboride electron source) according to a third embodiment.

DESCRIPTION OF EMBODIMENTS

As a result of intensive studies of inventors, it has been found that electrons can be emitted from a (310) crystal face of a tip end portion having a cone shape due to a Schottky effect by performing diameter reduction around a tip end portion of a columnar chip of a hexaboride single crystal to form a cone shape, cutting out the chip from a longitudinal direction and along a [310] orientation, constantly heating the columnar chip, and applying an electric field to a tip end of the chip. Further, it has been found that a Schottky emitter electron source is preferably controlled so that a chip temperature is higher than 900° C. and lower than 1250° C., and an electric field is preferably applied so that an electric field intensity at the tip end of the chip is larger than $3 \times 10^8$ V/m and smaller than $1.5 \times 10^9$ V/m.

It has been found that, by applying the Schottky emitter electron source to an electron beam device, it is possible to implement an electron beam device such as a scanning electron microscope that can perform surface observation with high spatial resolution and can also perform composition analysis at a large area, length measurement, and the like. In the following, crystal faces will be denoted according to mirror indexes, and a face will be denoted by ( ) and a crystal axis will be denoted by [ ].

The hexaboride single crystal is preferably a hexaboride of Ce or a hexaboride of a lanthanoid metal heavier than Ce. It is preferable that the columnar chip of the hexaboride single crystal is cut out from the longitudinal direction and along the [310] orientation, a tip end portion of the chip has a (310) crystal face, and electrons are emitted from the (310) crystal face.

The tip end portion of the columnar chip of the hexaboride single crystal is preferably processed to have a substantially hemispherical shape. A radius of curvature R of a substantially hemispherical portion preferably satisfies 50 nm<R<1 µm, and more preferably satisfies 150 nm<R<500 nm.

It is preferable that the columnar chip of the hexaboride single crystal has a quadrangular columnar shape or a cylindrical shape, and diameter reduction is performed at one side of the columnar chip to form a quadrangular pyramid shape or a cone shape.

It is preferable that the chip of the hexaboride single crystal is constantly heated so that a chip temperature T satisfies 900° C.<T<1250° C. and an electric field having an electric field intensity F satisfying $3 \times 10^8$ V/m<F<$1.5 \times 10^9$ V/m is applied to a tip end of the chip, so that electrons are emitted due to a Schottky effect. It is more preferable that the hexaboride single crystal is constantly heated so that the chip temperature T satisfies 1000° C.<T<1100° C.

The columnar chip of the hexaboride single crystal is held by a metal filament and a metal pipe that is fixed to the filament and has a plurality of recessed portions formed in at least two axis directions in a manner of surrounding a central axis in an outer periphery, and the columnar chip can be heated by the metal filament.

The columnar chip of the hexaboride single crystal can be manufactured by performing diameter reduction at one side (one end portion side) of a base portion of the columnar chip to form a cone shape by electropolishing, and further processing a tip end portion of the one side to form a substantially hemispherical shape by electropolishing, or performing diameter reduction at the one side (the one end portion side) of the base portion of the columnar chip to form a cone shape by electropolishing, and further processing the tip end portion of the one side to form a substantially hemispherical shape by electric field evaporation, or performing diameter reduction at the one side of the base portion of the chip to form a cone shape by electropolishing, and further processing the tip end portion of the one side to form a substantially hemispherical shape by a focused ion beam.

The electron source described above can be used in an electron beam device such as an electron microscope including a sample stage on which a sample is placed, an electron gun optical system having an extraction electrode that extracts electrons from the electron source and an acceleration electrode, or an extraction electrode, a control electrode, and an acceleration electrode, or an extraction electrode, a control electrode, an acceleration electrode, and a suppressor electrode, an electron optical system that focuses emitted electrons and irradiates the sample on the sample stage with the emitted electrons, a sample stage, a detector, and the like.

Hereinafter, the invention will be described according to embodiments with reference to the drawings. Although a scanning electron microscope (SEM) is described as an example in an embodiment of an electron beam device, the invention is not limited thereto, and can be applied to an electron beam device including a transmission electron microscope (TEM), a scanning transmission electron microscope (STEM), an electron beam exposure device, an electron beam 3D printer, and the like. In the following drawings, a scale of each configuration is appropriately changed in order to make the configuration of the invention easy to understand.

First Embodiment

In a first embodiment, a structure of a hexaboride Schottky emitter electron source and a method for manufacturing the electron source will be described with reference to FIGS. 2 to 22.

First, a rare earth hexaboride is used as a material of the electron source. Specifically, La, Ce, Pr, Nd, Sm, Eu, Gd, and the like, which are lanthanoid elements, can be used, and are respectively represented by chemical formulas $LaB_6$, $CeB_6$, $PrB_6$, $NdB_6$, $SmB_6$, $EuB_6$, and $GdB_6$, and the like.

FIG. 2 shows a unit cell of the electron source. The unit cell has a crystal structure in which six blocks of a boron atom 2 are located at the center of a simple cubic lattice of metal atoms 1. Generally, these materials are suitable as materials of an electron source having a high melting point, a low vapor pressure, high hardness, strong resistance to ion impact, and a lower work function than W. Among these materials, Ce and lanthanoid Pr, Nd, Sm, Eu, Gd, and the like having a larger atomic weight than Ce are suitable as a hexaboride material for preparing a Schottky emitter electron source in which f electrons having strong energy localization and high state density just below the Fermi level are present, density of electrons excited by heating is high, and current density is high.

These hexaborides can form a large single crystal 3 (see FIG. 3) having a diameter of several mm by melt (liquid phase) crystal growth using a floating zone method or the like, and a length of several 10 mm grown in a [100] crystal axis direction perpendicular to a (100) face of a crystal habit face on which a crystal grows preferentially.

When the single crystal 3 is used in a thermal emitter electron source, the single crystal 3 is cut out into a chip 4 (FIG. 34) having a square of several 100 μm and a length of several mm, and a (100) face is used as an electron emission face. A crystal structure of the hexaboride is a simple cubic lattice as shown in FIG. 2. The (100) face is equal to a (010) face or a (001) face, and a [100] crystal axis is equal to a [010] crystal axis, a [001] crystal axis, or the like. In the first embodiment, the [100] crystal axis in FIG. 2 is defined as a crystal habit axis and the (100) face is defined as a crystal habit face for convenience to make the following description.

As a result of a study of the inventors, when a hexaboride is used as a Schottky emitter electron source which will be described later, it is preferable to use the (310) face that has a lower work function than the (001) face and is easy to emit electrons as a main electron emission face in a similar manner to a case of a field emitter electron source.

FIG. 3 shows an atomic structure of the (310) face. In an electron source using a single crystal, a crystal face corresponding to a crystal axis appears at the center of a tip end, and an electron beam emitted from the crystal face passes over the crystal axis. In an electron microscope, an electron beam over an axis is used as a probe current, and a sample is irradiated using a lens or the like. Therefore, it is suitable to dispose the crystal face to be used on an axis at the center of the tip end of the electron source.

Therefore, first, a crystal axis of the single crystal 3 of the hexaboride was measured using an X-ray Laue method or the like, and the chip 4 was cut out by cutting the single crystal 3 of the hexaboride along a [310] crystal axis as shown in FIG. 4, that is, at an angle of 18.4° with respect to a [100] crystal axis of a long axis of the single crystal 3 of the hexaboride. A cross-sectional shape of the cut-out chip 4 preferably has a quadrangular columnar shape or a cylindrical shape in order to obtain shape symmetry in a diameter reduction processing by electropolishing, which will be described later. In the present embodiment, a large number of chips 4 processed into a quadrangular columnar shape having a side of 200 μm and a length of 5 mm were cut out.

However, it is also possible to form the (310) crystal face at the tip end of a chip cut out along an orientation other than the [310] orientation, and guide an electron beam emitted from outside of an axis to the axis by deflecting the electron beam by a deflector. In this case, although a configuration of an electron microscope becomes complicated, an electron beam emitted from the (310) face can be used using an electron source of a crystal axis other than the [100] axis or the like.

In recent years, with the development of a crystal growth technique using the floating zone method, a crystal can also directly grow in the [310] crystal axis direction instead of the [100] crystal axis direction which is a crystal habit axis.

FIG. 5 schematically shows a state in which the chip 4 having a quadrangular columnar shape with the (310) crystal face serving as an end face was cut out along the [310] crystal axis from the single crystal 3 growing in the [310] crystal axis direction. In this case, since the chip can be cut out without obliquely cutting the grown single crystal, the number of chips that can be cut out from the single crystal of the same size can be increased, and productivity can be increased. The same number of chips can be cut out from the single crystal having a smaller size than that in a case of obliquely cutting the single crystal. Since crystal defect density can be reduced as a crystal size prepared using the floating soon method becomes smaller, crystal quality is improved.

Next, a joining method for holding the hexaboride chip 4 and attaching a filament for heating the held chip 4 will be described. As a result of intensive studies of the inventors, it has been found that when a Schottky emitter electron source is prepared using the hexaboride chip 4, a metal pipe formed of a metal such as tantalum (Ta) and niobium (Nb) is provided, the hexaboride chip 4 is disposed inside the metal pipe, a plurality of recessed portions are formed on the chip 4 from at least two axis directions in a manner of surrounding a central axis, and a bottom portion of each of the plurality of recessed portions is in contact with an outer periphery of the hexaboride chip 4. Accordingly, the chip 4 and the metal pipe can be firmly and reliably joined so that the chip 4 does not fall off the metal pipe even after a long period of heating.

It has been found that more preferably, the plurality of recessed portions are formed at positions shifted in an axis direction of the metal pipe at the outer periphery of the metal pipe, and a bottom portion of each of the recessed portions is in contact with an outer periphery of the hexaboride, so that the chip 4 and the metal pipe can be more firmly joined without axis deviation.

Hereinafter, specific description will be made. First, a method for manufacturing a metal pipe used for joining with the hexaboride chip 4 will be described. FIG. 6 shows a process of manufacturing the metal pipe. A material of the metal pipe is a metal having a high melting point, such as tantalum and niobium, and is suitably a material that is rich in ductility, easy to form a minute metal pipe by drawing the pipe, or easy to be processed with recessed portions, which will be described later.

In the present embodiment, tantalum is used as an example. First, a metal sheet 5 of tantalum as shown in (a) of FIG. 6 is rolled up, and as shown in (b) of FIG. 6, two ends 6 of the rolled-up metal sheet 5 are subjected to electron beam welding to form a semi-seamless pipe 7 of tantalum having a large diameter. Subsequently, as shown (c) of FIG. 6, a metal pipe 9 having an outer diameter of Φ 500 μm, an inner diameter of Φ 320 μm, and a thickness of 90 μm is prepared by repeatedly performing a pipe drawing processing of drawing the semi-seamless pipe 7 of tantalum using a die 8. Next, as shown in (d) of FIG. 6, the metal pipe 9 was cut off at every 5 mm by a cutter 10 to prepare a minute metal pipe 12.

In the present embodiment, since the chip 4 of the electron source is joined with the metal pipe 12 after being inserted into the metal pipe 12 as will be described later, an inner diameter of the metal pipe 12 is preferably approximately 1.1 to 1.5 times of a maximum diameter (a length of a diagonal line when a cross section of the chip 4 is a square, a diameter when a cross section of the chip 4 is a circle) of the chip 4. When the diameter of the metal pipe 12 is 1.1 times or less of the maximum diameter of the chip 4, since a processing tolerance of the chip 4 is usually approximately 10%, the number of chips 4 that cannot be inserted into the metal pipe 12 increases, and a manufacturing yield of the electron source is reduced. On the other hand, when the diameter of the metal pipe 12 is 1.5 times or more of the maximum diameter of the chip 4, a dimensional difference between the inner diameter of the chip 4 and the inner diameter of the metal pipe 12 is too large, a deformation amount of the metal pipe 12 in a processing of forming and joining recessed portions to be described later is large, assembly accuracy is low or assembly strength is low, a volume of the metal pipe 12 increases, and heat capacity increases, which will lead to an increase in power consumption or low heating responsiveness.

Therefore, when the chip 4 has a side of 200 μm (has a quadrangular columnar shape having a maximum diameter of approximately 282 μm), the inner diameter of the metal pipe 12 is preferably in a range of 310 μm to 423 μm. In the present embodiment, the inner diameter of the metal pipe 12 is 320 μm.

In the present embodiment, a filament needs to be spot-welded to the metal pipe 12 as will be described later, and the metal pipe 12 needs to have sufficient strength since the metal pipe 12 needs to have resistance to high temperature heating for a long period of time during an operation. On the other hand, when a thickness of the metal pipe 12 is too large, heat capacity of the metal pipe 12 increases, which will lead to low heating responsiveness of the electron source or an increase in heating power. As a result of intensive studies of the inventors, it has been found that the Schottky emitter electron source according to the present embodiment has a relatively low operation temperature at 900° C. to 1250° C. as will be described later. Therefore, it is fine as long as the thickness of the metal pipe 12 is 50 μm or more. In the present embodiment, the thickness of the metal pipe 12 is 90 μm.

Next, a method for joining the hexaboride chip 4 using the metal pipe 12 will be described. First, as shown in FIG. 7, a pedestal 14 on which a guide pin 13 having a diameter of 300 μm which is smaller than the inner diameter of the metal pipe 12 and a length of 1 mm to 3 mm stands vertically is used, and the guide pin 13 is inserted into a hole of the metal pipe 12, so that the metal pipe 12 stands vertically on the pedestal 14. Further, the hexaboride chip 4 is inserted into the hole of the metal pipe 12 from above until the chip 4 abuts against the guide pin 13. A length (a protruding amount P) of the hexaboride chip 4 protruding from an inside of the metal pipe 12 can be controlled by setting a length of the guide pin 13.

When the Schottky emitter electron source is prepared, since the hexaboride chip 4 is shaved by electropolishing as will be described later, the protruding amount P is 2 mm to 3 mm.

Subsequently, as shown in FIG. 8, the metal pipe 12 into which the hexaboride chip 4 is inserted is press-contacted with the chip 4 using a press-contact tool from four sides along two axes that are orthogonal to each other in a plane perpendicular to a longitudinal direction of the chip 4. FIG. 8 only shows a part of blades 15 of the press-contact tool for description. A protrusion 151 for forming a recessed portion on the metal pipe 12 is provided at a tip end of each of the blades 15 of the press-contact tool. The blades 15 of the press-contact tool are moved forward by equal strokes along guides (not shown) along two axes from four sides and are brought close to the metal pipe 12, and the protrusions 151 are further moved forward by a predetermined amount in a state in which the metal pipe 12 are pressed from four sides, so that the metal pipe 12 is crushed to form recessed portions and the hexaboride chip 4 is press-contacted with the metal pipe 12.

During an operation, a positional relation between the metal pipe 12 and the hexaboride chip 4 is checked using an entity microscope 16, and a rotation axis of the chip 4 is appropriately adjusted so that each side face of the hexaboride chip 4 having a quadrangular columnar shape coincides with a stroke direction of each of the blades 15 of the tool. Accordingly, a plurality of recessed portions are formed in a manner of surrounding a central axis from an outer periphery of the metal pipe 12, and a bottom portion of each of the recessed portions is in contact with an outer peripheral surface of the hexaboride chip 4 so that the hexaboride chip 4 can be automatically fixed along the central axis of the metal pipe 12.

FIGS. 9A to 9C are schematic views showing the hexaboride chip 4 and the metal pipe 12 that are joined using the above-described method according to the present embodiment. FIG. 9A is a cross-sectional view showing joint portions as viewed from an upper side of the chip 4. FIG. 9B is an overall perspective view. FIG. 9C is a cross-sectional view showing the chip 4 as viewed from a front side. The hexaboride chip 4 inserted into the metal pipe 12 is press-contacted and fixed to the metal pipe 12 by four recessed portions 17 formed on the metal pipe 12.

When a four-point joining method for fixing the hexaboride chip 4 by the four recessed portions 17 as in the present embodiment is used, the metal pipe 12 and the hexaboride chip 4 can be press-contacted with each other equivalently along two axes from four sides by the protrusions 151 at the tip ends of the blades 15 of the press-contact tool, and mechanically strong joint can be achieved. Since the protrusions 151 at the tip ends of the blades 15 of the press-contact tool are brought close to the metal pipe 12 along two axes from four directions by equal strokes, and the outer periphery of the metal pipe 12 is crushed, the hexaboride chip 4 having a quadrangular columnar shape can be joined with the metal pipe 12 by being automatically aligned with the central axis of the metal pipe 12.

Accordingly, since accuracy of assembling the hexaboride chip 4 having a quadrangular columnar shape and the metal pipe 12 is improved, an axis of the electron source can be easily defined by only adjusting a position of the metal pipe 12 with respect to the blades 15 of the press-contact tool in four directions. As a result, a yield of assembling the hexaboride chip 4 and the metal pipe 12 is increased. Since a portion 12-1 which is shown by dotted lines and into which the guide pin 13 is inserted is no longer needed, the portion 12-1 is cut off by a cutter in order to reduce heat capacity of the metal pipe 12.

FIG. 10 shows assembly of the hexaboride chip 4 and the metal pipe 12 according to a modification for achieving a joining method by which strength of the assembly can be further improved and an axis can be more accurately defined. In the present modification, two-stage protrusions 152 and 153 in an upper-lower direction are formed at a portion of the tip end of each of the blades 15 of the press-contact tool. At positions shifted in an axis direction of the metal pipe 12, recessed portions 172 and recessed portions 173 can be formed at four positions in the same cross section in the axis direction by molding the metal pipe 12 using such a press-contact tool.

FIGS. 11A to 11C are schematic views showing the hexaboride chip 4 and the metal pipe 12 that are joined together using the press-contact tool as shown in FIG. 10. FIG. 11A is a cross-sectional view showing joint portions as viewed from an upper side of the chip 4. FIG. 11B is an overall perspective view. FIG. 11C is a cross-sectional view showing the chip 4 as viewed from a front side. FIGS. 11B and 11C respectively correspond to FIGS. 9B and 9C. Similar to a case shown in FIGS. 9B and 9C, a portion into which the guide pin 13 is inserted is cut off by a cutter in order to reduce heat capacity of the metal pipe 12 in a case shown in FIGS. 11B and 11C.

As described above, the chip 4 and the metal pipe 12 are joined at positions shifted in the axis direction, so that a joint force is further increased. The chip 4 and the metal pipe 12 are joint at two positions in an upper-lower manner along the axis direction, so that the chip 4 can be prevented from being inclined at joint portions and accuracy of defining an axis is further improved. Although there is no restriction on the number of stages of protrusions in the upper-lower direction, it is desirable that the number of stages is approximately two since when there are too many stages of protrusions, a length of the metal pipe 12 needs to be increased to form recessed portions and heat capacity is increased.

Subsequently, as shown in FIG. 12, a central portion of a filament 18 formed of tungsten or the like in a length direction of the filament 18 is directly spot-welded to the metal pipe 12 to which the hexaboride chip 4 is joined, and then two ends of the filament 18 are each spot-welded to a respective one of a pair of electrodes 20 fixed to a stem 19.

Since joining of the metal pipe 12 and the central portion of the filament 18 by spot-welding and joining of the two ends of the filament 18 and the pair of electrodes 20 are joining between metals, easy and strong joining can be achieved.

When spot-welding is performed, a position alignment jig 21-1 as shown in FIG. 13A and a position alignment jig 21-2 as shown in FIG. 13B are used. First, as shown in FIG. 13A, the filament 18 formed of tungsten or the like and the metal pipe 12 to which the hexaboride chip 4 is joined are mounted on the position alignment jig 21-1 on which groove portions 131 and 181 are formed so as to accommodate the metal pipe 12 and the filament 18 at positions corresponding to the metal pipe 12 and the filament 18, and positions of the metal pipe and the filament 18 are accurately aligned. Next, spot-welding is performed in this state, and the metal pipe 12 and the central portion of the filament 18 in the length direction of the filament 18 are connected to each other.

Subsequently, as shown in FIG. 13B, the stem 19 and the metal pipe 12 to which the filament 18 is connected are mounted on the position alignment jig 21-2 on which groove portions 132 and 191 are formed so as to accommodate the stem 19 and the metal pipe 12 at corresponding positions, and positions of the stem 19 and the metal pipe 12 are accurately aligned. In this state, since the central axis of the metal pipe 12 and a central axis of the hexaboride chip 4 are aligned, an axis can be defined with high accuracy. Next, spot-welding is performed in this state, and the stem 19 and the metal pipe 12 are connected to each other.

In the embodiment described above, the hexaboride chip 4 cut into a quadrangular columnar shape was used. The chip 4 may be processed into a cylindrical shape. FIGS. 14A to 14C show an example in which a hexaboride chip 41 having a cylindrical shape is used. FIG. 14A is a cross-sectional view showing joint portions as viewed from an upper side of the chip 41. FIG. 14B is an overall perspective view. FIG. 14C is a cross-sectional view showing the chip 41 as viewed from a front side.

When the hexaboride chip 41 having a cylindrical shape and the metal pipe 12 are joined, the recessed portions 174 and 175 may be formed on the metal pipe 12 at two positions in an upper-lower manner along an axis direction from three directions by press-contacting the metal pipe 12 with the hexaboride chip 41 from three directions along at least three axes at equal intervals in a plane perpendicular to a vertical direction of the chip 41 using a press-contact tool having a similar shape to that shown in FIG. 10. Similar to the case of the chip 4 having a quadrangular columnar shape described with reference to FIGS. 8 to 11, when the hexaboride chip 41 having a cylindrical shape is used, the metal pipe 12 and the hexaboride chip 41 may be joined by being press-contacted with each other from four directions along two axes orthogonal to each other using the press-contact tool.

Subsequently, a method for reducing a diameter, to form a cone shape, around a tip end portion of the hexaboride chip 4 where the hexaboride chip 4 fixed to the metal pipe 12 protrudes from the metal pipe 12, and processing the tip end of the tip end portion to a hemispherical shape will be described. As a result of intensive studies of the inventors, it has been found that when the Schottky emitter electron source (SE) of the hexaboride is prepared, since it is required to apply a relatively strong electric field to the tip end of the hexaboride chip, the tip end of the hexaboride chip to be used as a thermal emitter electron source (TE) needs to be thinned and reduced in diameter, but it is not preferable to sharpen a tip end of a chip such as a chip to be used as a field emitter electron source (FE).

In the Schottky emitter electron source (SE) using the hexaboride chip 4, when the tip end of the chip 4 is excessively sharpened, an excessive electric field is applied to the tip end of the chip, and when the Schottky emitter electron source (SE) is heated, not only Schottky emission electrons are emitted, but also field emission electrons and thermal field emission electrons are simultaneously emitted.

FIG. 15 is an energy diagram showing such a situation. The field emission electrons indicated by energy full width at half maximum $\Delta E_{FE}$ are sensitive to a work function change of a surface as compared with the Schottky emission electrons indicated by energy full width at half maximum $\Delta E_{SE}$, and an emitter current is likely to become unstable. The field emission electrons are electrons that permeate a work function barrier based on a Fermi level due to a quantum tunnel phenomenon and are directly taken out from a metal into a vacuum. The field emission electrons have different energy positions from emitted electrons due to a Schottky effect that are electrons emitted by transmitting thermally excited electrons through a work function barrier that is reduced due to the Schottky effect by applying an electric field to the thermally excited electrons.

Further, thermal field emission (TFE) in which electrons that are thermally excited below a work function barrier permeate a work function barrier due to a quantum mechanical tunnel phenomenon are also mixed. Therefore, monochromaticity of electrons emitted from the tip end of the chip is significantly reduced. In FIG. 15, $\Delta E_{TFE}$ indicates energy full width at half maximum of emitted electrons of the thermal field emission.

Therefore, a process is developed in the present embodiment in which diameter reduction is performed by primary electropolishing around the tip end portion of the columnar hexaboride chip 4 to form a cone shape, only the tip end of the tip end portion is rounded to form a substantially hemispherical shape by performing electropolishing again, or electric field evaporation, or focused ion beam processing, and the tip end portion is processed to a shape with which an electric field is not excessively concentrated.

As shown in FIG. 16, primary electropolishing is performed by dipping the tip end of the hexaboride chip 4 assembled according to procedures described with reference to FIG. 13 into an electropolishing liquid 22 such as nitric acid placed in a container (electropolishing liquid tank) 220, and applying a voltage from an AC or DC power supply 24 between the electrodes 20 and a counter electrode 23 formed of platinum or the like and formed in a ring shape.

As shown in FIG. 17, when the hexaboride chip 4 is soaked in the electropolishing liquid 22, a meniscus is formed on a liquid surface, and a polishing speed at a liquid surface portion 401 is slower than a polishing speed at a liquid intermediate portion 402. As the electropolishing being advanced, a polished area is reduced, and accordingly an electrolytic current decays. If the power supply 24 is turned off when the electrolytic current decays to a certain level, a tip end portion 403 as indicated by dotted lines shown in FIG. 17 can be processed to have a tapered cone 40. When the chip 4 has a quadrangular columnar shape, the cone 40 is processed to a quadrangular pyramid having a tapered tip end, and when the chip 4 has a cylindrical shape, the cone 40 is processed to a cone having a tapered tip end.

FIG. 18(b) shows an SEM image of the tapered cone 40 obtained by processing the tip end portion of the chip 4 having a quadrangular columnar shape to have a quadrangular pyramid shape. FIG. 18(a) shows an SEM image obtained by enlarging the tip end portion 403 of the cone 40 of the chip 4, which has a quadrangular pyramid shape and is surrounded by a circle in FIG. 18(b).

FIG. 19 shows SEM images of the hexaboride chip 4. In the cone 40 of the hexaboride chip 4, tip end portion 403 is processed as shown in FIG. 18(a) by electropolishing, and the tip end of the cone 40 is processed into a substantially hemispherical shape by performing electropolishing again. When a portion around the tip end portion 403 is soaked in the electropolishing liquid 22 and is polished until there is no electrolytic current, the tip end portion 403 can be rounded to have a substantially hemispherical shape. FIG. 19(b) shows an SEM image around the tip end portion of the cone 40 of the chip 4 whose tip end is rounded to have a substantially hemispherical shape. FIG. 19(a) shows an SEM image obtained by enlarging a tip end portion 404 of the cone 40 of the chip 4, which is surrounded by a circle in FIG. 19(b).

The tip end portion 403 of the cone 40 of the chip 4 can be rounded to have a substantially hemispherical shape by electric field evaporation. The electric field evaporation is a method of ionizing and gradually peeling off atoms on a surface of a tip end by applying a positive electric field of + several tens of V/nm to an electron source. The electric field evaporation occurs preferentially at positions where electric field intensity is high. Therefore, atoms at a sharp position or a step portion of a surface can be evaporated, and atoms on the entire surface can be evaporated over time. Finally, when the electric field evaporation is sufficiently performed, electric field intensity is uniform over the entire surface of the tip end of the electron source, and the tip end of the electron source is processed to have a substantially hemispherical shape.

FIG. 20 shows SEM images of the cone 40 of the hexaboride chip 4 of which a portion around the tip end portion 403 of the cone 40 of the chip 4 that has been electropolished as shown in FIG. 18(a) is rounded to have a substantially hemispherical shape by electric field evaporation so as to form a tip end portion 405. FIG. 20(b) shows an SEM image around the tip end portion of the cone 40 of the chip 4 whose tip end is rounded to have a substantially hemispherical shape. FIG. 20(a) shows an SEM image obtained by enlarging the tip end portion 405 of the cone 40, which is surrounded by a circle in FIG. 20(b).

The tip end portion 403 of the cone 40 of the chip 4 can be rounded to have a substantially hemispherical shape by performing a focused ion beam (FIB) processing using Ga ions. FIG. 21 shows SEM images of the hexaboride chip whose tip end is rounded by being irradiated with a focused ion beam shaped from an upper side of the tip end of the chip 4 sharpened by electropolishing. FIG. 21(b) shows an SEM image around the tip end portion of the chip 4 whose tip end is rounded to have a substantially hemispherical shape. FIG. 21(a) shows an SEM image obtained by enlarging a tip end portion 406 of the chip 4, which is surrounded by a circle in FIG. 21(b).

The tip end portion 403 of the cone 40 of the hexaboride chip 4 can be processed to have a substantially hemispherical shape by any one of the processings described above. In this case, a radius R of each of the tip end portions 404 to 406 of the cone 40 of the chip 4 processed to have a substantially hemispherical shape preferably satisfies 50 nm<R<1 μm.

When the radius R of each of the tip end portions 404 to 406 of the cone 40 is 50 nm or less, electric field concentration is likely to occur at the tip end portions 404 to 406 of the cone 40, a threshold voltage of field emission is reduced, and a dynamic range of extraction voltages at which the Schottky emission electrons are obtained is too narrow. Therefore, it is difficult to control an electron beam device. On the other hand, when the radius R of each of the tip end portions 404 to 406 is 1 μm or more, an extraction voltage is too high, and at the same time, chromatic aberration and a virtual light source diameter of the electron source, which is an element for determining spatial resolution of a scanning electron microscope are too large, and spatial resolution of the scanning electron microscope is reduced.

More preferably, the radius R of each of the tip end portions 404 to 406 satisfies 150 nm<R<500 nm. When the radius R is within such a range, there are advantages that a range of extraction voltages at which the Schottky emission electrons are obtained as will be described later can be set to a voltage range of several 100 V to several kV which is a preferable voltage range for handling with an electron beam device, and at the same time, a virtual light source diameter is appropriately reduced and an electron emission surface is increased appropriately, so that a Coulomb interaction between electrons after electron emission is small, and an unnecessary increase in an energy width at a time of transporting an electron beam is less likely to occur.

Subsequently, surface activation of the Schottky emitter electron source using the hexaboride chip 4 is performed. Since an oxide or the like is formed on a surface of the hexaboride chip 4 that has been electropolished, electrons cannot be emitted as it is. Therefore, the electron source prepared as described above was introduced into a vacuum device and subjected to a heating annealing at approximately 1150° C. for 10 hours to 20 hours to perform surface activation of growing an electron emission surface.

FIG. 22 shows an example in which an electron emission surface of the tip end portion 404 of the hexaboride chip 4 of the electron source on which surface activation is performed by heating annealing is observed with a field emission microscope (FEM). Four-fold symmetric bright electron emission is attained. A dark portion at the center of the image is the (100) face, and bright portions are the (310) face and crystal faces equivalent to the (310) face.

Thus, the Schottky emitter electron source (SE) using the hexaboride chip 4 according to the present embodiment can be completed.

According to the present embodiment, the tip end portion of the hexaboride chip is molded to have a radius R satisfying 50 nm<R<1 μm, and more preferably satisfying 150 nm<R<500 nm, and the (310) face of the hexaboride is an electron emission face, so that it is possible to obtain an electron source capable of obtaining the Schottky emission electrons having an appropriate virtual light source diameter at an extraction voltage within a range of several 100 V to several kV which is a voltage range preferable for handling with an electron beam device to be described later.

Second Embodiment

A second embodiment describes a relation between a voltage (electric field)-current characteristic and a heating temperature when the Schottky emitter electron source using the hexaboride chip 4 prepared according to the first embodiment is operated in an evaluation vacuum device, and describes that electrons are actually emitted due to the Schottky effect.

Here, an example in which a CeB$_6$ electron source is used as the hexaboride chip 4 is described. In the CeB$_6$ electron source, a radius of curvature R of the tip end of the chip 4 is 0.2 μm. FIG. 23 shows a state in which the filament 18 is actually energized to heat the CeB$_6$ electron source and the CeB$_6$ electron source is measured with a colorimetric thermometer 25. FIG. 24 shows a relation between a filament current flowing in the filament 18 and a heating temperature of the chip 4 of the CeB$_6$ electron source. In FIG. 23, a shining portion having a U shape at an upper side is a filament of the colorimetric thermometer 25.

In a graph in FIG. 24, a dot sequence 2401 indicated by ○ is a luminance temperature ° Cb which is a measured value of a colorimetric temperature, a dot sequence 2402 indicated by • is a true temperature ° C. calculated in consideration of emissivity of CeB$_6$ of 0.68. It can be seen from the graph in FIG. 24 that in the electron source used in the present embodiment, a temperature of the chip 4 that is held in the metal pipe 12 connected to the filament 18 can be controlled in a range of 900° C. to 1260° C. by energizing the filament 18 with a current of 3.1 A to 3.6 A.

FIG. 25 is a diagram (only a right half side is shown since the diagram is rotational symmetric) showing a positional relation between the chip 4 and an extraction electrode 26 in the evaluation vacuum device. The extraction electrode 26 has a ring shape with a radius of 6 mm. A substantially hemispherical tip end portion 410 (a portion corresponding to the tip end portion 404 in FIG. 19, the tip end portion 405 in FIG. 20, or the tip end portion 406 in FIG. 21) of the cone 40 of the chip 4 of the CeB$_6$ electron source was provided at the center of the extraction electrode 26.

An extraction voltage applied to the extraction electrode 26 was controlled in a range of 0.1 kV to 2.9 kV. Electric field intensity applied to the tip end of the chip 4 connected to the filament 18 was calculated by performing an electric field simulation according to an arrangement in FIG. 25. A support member 261 supports the extraction electrode 26.

FIG. 26 shows an example of a result of an electric field intensity simulation performed based on the configuration shown in FIG. 25. It can be seen from the result that an electric field is concentrated at an outer side 420 (a white portion above the tip end portion 410 in FIG. 26) of the substantially hemispherical tip end portion 410 of the cone 40 of the chip 4.

FIG. 27 shows a voltage-current (V-I) characteristic of an obtained extraction voltage Ve (or electric field intensity F) and a total current It of emitted electrons. Temperatures of the chip 4 are displayed as parameters. In FIG. 27, a dot sequence 2701 shows a voltage-current (V-I) characteristic when a temperature of the chip 4 is 1131° C., a dot sequence 2702 shows a voltage-current (V-I) characteristic when a temperature of the chip 4 is 1099° C., a dot sequence 2703 shows a voltage-current (V-I) characteristic when a temperature of the chip 4 is 1067° C., a dot sequence 2704 shows a voltage-current (V-I) characteristic when a temperature of the chip 4 is 1035° C., a dot sequence 2705 shows a voltage-current (V-I) characteristic when a temperature of the chip 4 is 1003° C., a dot sequence 2706 shows a voltage-current (V-I) characteristic when a temperature of the chip 4 is 972° C., a dot sequence 2707 shows a voltage-current (V-I) characteristic when a temperature of the chip 4 is 940° C., and a dot sequence 2708 shows a voltage-current (V-I) characteristic when a temperature of the chip 4 is a room temperature (R.T.).

The characteristic obtained at the room temperature (R.T.) indicated by the dot sequence 2708 is a V-I characteristic of field emission electrons, and it can be seen that a threshold voltage of field emission of the CeB$_6$ electron source is approximately 2200 V (electric field intensity is $1.65 \times 10^9$ V/m).

On the other hand, as indicated by the dot sequence 2707, when the chip 4 is heated to 900° C. or higher, an emitter current can be obtained from an extraction voltage lower than that in a case in which the temperature of the chip 4 is the room temperature, it is considered that thermal electrons or electrons emitted due to a Schottky effect are emitted.

Whether the obtained emitter current is electrons emitted due to a Schottky effect can be determined by making a Schottky plot. As shown in FIG. 1(c), electron emission due to the Schottky effect occurs when a height of a work function barrier is reduced due to an application of a high electric field and a mirror image potential of a surface and thermally excited electrons are emitted to a vacuum.

Emitter current density $J_s$ at this time is as follows.

$$J_s = AT^2 \exp\left(-\frac{\varphi - \beta\sqrt{V}}{kT}\right) \quad \text{[Formula 1]}$$

$$\beta = \frac{e^3}{4\pi\varepsilon_0 d} \quad \text{[Formula 2]}$$

Here, A is a Richardson constant, T is an absolute temperature, k is a Boltzmann constant, $\varphi$ is a work function, $\beta$ is a geometric factor, V is a voltage, e is elementary charge, $\varepsilon_0$ is a vacuum dielectric constant, and d is a distance between electrodes.

When (Formula 1) is rewritten, it can be expressed by (Formula 3).

$$\ln\frac{J_s}{T^2} = \ln A - \frac{\varphi}{kT} + \frac{\beta}{kT}\sqrt{V} \quad \text{[Formula 3]}$$

According to Formula 3, in a case in which a vertical axis is logarithm of emitter current density $J_s$ and a horizontal axis is a square root of an applied voltage V, a linear relation can be obtained when an emitter current is generated due to the Schottky effect.

The plot is shown in FIG. 28. In a graph shown in FIG. 28, logarithm of a total current It is shown as the vertical axis ln It instead of the logarithm of the emitter current density $J_s$. It has been found that electrons emission due to the Schottky effect (Schottky emission region) is attained when the square root of the applied voltage shown on the horizontal axis is in a range of $20<Ve^{0.5}<45$, that is, when an extraction voltage Ve is in a range of 400 V<Ve<2000 V, an applied electric field F obtained by converting the extraction voltage Ve to the applied electric field F is in a range of $0.3\times10^9$ V/m<F<$1.5\times10^9$ V/m.

In a case in which the applied voltage (electric field) is less than the above range, an emitter current is small due to space charge (space charge restriction region), and in a case in which the applied voltage (electric field) is larger than the above range, field emission electrons are mixed (field emission mixing region). Since an emitter current is not stable in these cases, the applied voltages (electric fields) in these cases are not preferable.

A graph at an upper side of FIG. 29 shows a total current 2901 measured by setting the temperature of the chip 4 to 940° C. and changing the extraction voltage Ve, and a probe current 2902 detected in a probe hole having a diameter of Φ 2 mm and provided at a tip at a distance of 29 mm from the tip end of the chip 4 of the electron source. A lower side of FIG. 29 shows FEM images of electron emission surfaces of the chip 4 of the electron source observed at extraction voltages Ve at (1) to (4) in the graph shown at the upper side.

In regions where the extraction voltage Ve is relatively low and that correspond to FEM images (1) and (2) in FIG. 29, the center of a fluorescent face due to Schottky emission electrons from the tip end of the electron source shines. On the other hand, in regions where the extraction voltage Ve is relatively high and that correspond to FEM images (3) and (4) indicating that the extraction voltage exceeds 2 kV, a four-fold symmetry FEM image from the (310) crystal face, which is similar to that shown in FIG. 22, is mixed, and field emission electrons are mixed in the Schottky emission electrons. Therefore, it is considered that a main electron emission face for the Schottky emission electrons is also the (310) crystal face having a low work function.

FIG. 30 shows radiation angle current density JΩ calculated based on a probe current Ip in the Schottky emission region and an intake solid angle of the probe hole. In the present embodiment, as indicated by dot sequences 3001 to 3007 in a graph in FIG. 30, radiation angle current density in a range of several μA/sr to 1000 μA/sr or more was obtained as JΩ when a temperature T of the chip 4 is in a temperature range of 940° C. to 1131° C.

Based on a similar experiment other than that described in the present embodiment, it has been found that electron emission can be attained according to a Schottky plot when the temperature T of the chip 4 is in a range of 900° C.<T<1250° C. In particular, it is preferable that the temperature T of the chip 4 is in a range of 1000° C.<T<1100° C. since radiation angle current density, serving as radiation angle density JΩ, in a range of several 10 μA/sr to 1000 μA/sr which is easy for an electron microscope to use can be obtained.

When the temperature of the chip 4 is set to 1000° C. or less, surface diffusion of Ce of $CeB_6$ constituting the chip 4 is insufficient, and a scattering amount of Ce from a surface due to ion impact of residual gases generated when the electron source is used in an electron beam device is not sufficiently compensated. Therefore, a current tends to decay over a long period of time. On the other hand, when the chip 4 is operated at 1100° C. or higher, the surface diffusion of Ce of $CeB_6$ constituting the chip 4 is too large, a current tends to increase over a long period of time, and the life of the electron source tends to be shortened.

A graph in FIG. 31 shows a measurement result of energy full width at half maximum of the Schottky emission electrons. In the graph in FIG. 31, a horizontal axis indicates the radiation angle current density JΩ and a vertical axis indicates energy full width at half maximum ΔE of the Schottky emission electrons. In FIG. 31, • indicates measurement results 3101.

It can be seen from the measurement results shown in FIG. that the energy full width at half maximum ΔE is approximately 0.25 eV to 0.4 eV when the radiation angle current density JΩ is in a range of 100 μA/sr to 300 μA/sr, and the $CeB_6$ Schottky emitter electron source has good monochromaticity compared with energy full width at half maximum of a ZrO/W Schottky emitter electron source in the related art. This is because an operation temperature of the $CeB_6$ Schottky emitter electron source is lower than an operation temperature of the ZrO/W Schottky emitter electron source in the related art by 300° C. to 500° C., electron state density of $CeB_6$ just below the Fermi level is localized due to a contribution of an f trajectory, and the like.

According to the present embodiment, it has been found that in the Schottky emitter electron source using the hexaboride chip 4 prepared in the first embodiment, when the temperature of the chip 4 is set to 900° C. to 1250° C., electron emission according to the Schottky plot can be performed, and particularly, when the temperature of the chip 4 is set to 1000° C. to 1100° C., radiation angle current density of several 10 µA/sr to 1000 µA/sr which is easy for an electron microscope to use can be stably attained. It has also been found that the CeB$_6$ Schottky emitter electron source has good monochromaticity when the radiation angle current density is in a range of 100 µA/sr to 300 µA/sr as compared with energy full width at half maximum of the ZrO/W Schottky emitter electron source in the related art.

Third Embodiment

A third embodiment will be described with reference to FIG. 32. Matters described in the first or second embodiment and not described in the third embodiment can also be applied to the third embodiment unless otherwise specified. The third embodiment describes an example of a scanning electron microscope mounted with the CeB$_6$ Schottky emitter electron source using the hexaboride chip 4 that is prepared according to the first embodiment and whose electron emission characteristic (radiation angle current density) is evaluated according to the second embodiment. Although the scanning electron microscope using the CeB$_6$ Schottky emitter electron source is described as an example in the third embodiment, a form of an electron source or an electron beam device is not limited thereto.

FIG. 32 is a schematic diagram showing a scanning electron microscope 3200 according to the third embodiment. The scanning electron microscope 3200 according to the present embodiment includes a CeB$_6$ Schottky emitter electron source 100, an extraction electrode 105, a positive electrode 108, a first condenser lens 109, an aperture stop 110, a second condenser lens 111, an objective lens 112, an astigmatism correction coil 113, a deflection scanning coil 114, a computer 101, a controller 102, a heating power supply 103, an extraction power supply 104, an acceleration power supply 107, an electron source lens barrel 121, an electron optical system lens barrel 122, and a sample chamber 123. In addition, a vacuum evacuation unit (not shown) is also provided.

The CeB$_6$ Schottky emitter electron source 100, the extraction electrode 105, and the positive electrode 108 are disposed inside the electron source lens barrel 121. The first condenser lens 109, the aperture stop 110, the second condenser lens 111, the objective lens 112, the astigmatism correction coil 113, and the deflection scanning coil 114 are disposed inside the electron optical system lens barrel 122. Amounting table 117 on which a sample 115 is placed is provided inside the sample chamber 123. The electron source lens barrel 121, the electron optical system lens barrel 122, and the sample chamber 123 are spatially connected, and insides thereof are evacuated to a vacuum by a plurality of vacuum evacuation units (not shown).

A configuration of the CeB$_6$ Schottky emitter electron source 100 is substantially the same as that described with reference to FIG. 16 in the first embodiment. The conical tip end portion of the cone 40 of the chip 4 formed of the hexaboride CeB$_6$ is processed to have a substantially hemispherical shape as that of the tip end portions 404, 405, or 406 as described with reference to FIGS. 19 to 21.

With such a configuration, the CeB$_6$ Schottky emitter electron source 100 constantly heats the filament 18 and the chip 4 by applying a constant current by the heating power supply 103 controlled by the computer 101 and the controller 102. In this state, electrons are emitted from the tip end of the chip 4 due to the Schottky effect by applying a positive voltage to the extraction electrode 105 relative to the tip end of the chip 4 by the extraction power supply 104.

An electron beam 106 is emitted from the tip end of the chip 4 and passes through the extraction electrode 105 to have a beam shape. The electron beam 106 is accelerated toward the grounded positive electrode 108 by applying a negative high voltage by the acceleration power supply 107, and is focused by the first condenser lens 109, the aperture stop 110, the second condenser lens 111, the objective lens 112, and the astigmatism correction coil 113. The deflection scanning coil 114 performs scanning with the electron beam 106 to irradiate an observation region on the sample 115, and generated secondary electrons are detected by a secondary electron detector 116.

Although a two-electrode configuration including the extraction electrode 105 and the positive electrode 108 is described as an example in the present embodiment, the scanning electron microscope 3200 may have a three-electrode configuration in which a control electrode is provided between the extraction electrode 105 and the positive electrode 108, or a four-electrode configuration in which a suppressor electrode is provided in a manner of surrounding the chip in front of the extraction electrode 105. Instead of performing scanning with the electrons by the deflection scanning coil 114, a deflection electrode that includes a pair of counter electrodes each located in a respective one of an X direction and a Y direction, that controls an electric field generated between the counter electrodes, and that performs scanning with the electrons may be used. Although a detector other than the secondary electron detector 116 is not shown, a reflected electron detector, an elemental analyzer, or the like may be further used.

Since the electrons emitted from the CeB$_6$ Schottky emitter electron source 100 according to the present embodiment have a small energy full width at half maximum and good monochromaticity, chromatic aberration in the objective lens 112 or the like can be reduced, the sample 115 can be irradiated with the more focused electron beam 106, and a scanning electron microscope image having high resolution can be obtained.

Since the electrons emitted from the CeB$_6$ Schottky emitter electron source 100 according to the present embodiment have high radiation angle current density, imaging time can be shortened, and analysis time of an elemental analysis or the like can also be shortened. Further, since long-term stability of an emitter current is high, the CeB$_6$ Schottky emitter electron source 100 can also be used in an electron microscope to be used in, for example, a mass production factory such as length measurement of a semiconductor device in a semiconductor factory.

The embodiments described above have been described in detail for easy understanding of the invention, and are not necessarily limited to those including all the configurations described above. A part of a configuration of one embodiment can be replaced with a configuration of another embodiment, and the configuration of the another embodiment can be added to the configuration of the one embodiment. A part of a configuration of each embodiment may be added to or replaced with another configuration, or may be deleted.

REFERENCE SIGN LIST 1 metal atom
2 boron atom
3 single crystal 4 chip
5 metal sheet
6 two ends of metal sheet
7 semi-seamless pipe
8 die
9 metal pipe
10 cutter
12 metal pipe
13 guide pin
14 pedestal
15 blade
16 entity microscope
17 recessed portion
18 filament
19 stem
20 electrode
21 position alignment jig
22 electropolishing liquid
23 counter electrode
24 power supply
25 colorimetric thermometer
26 extraction electrode
100 CeB$_6$ Schottky emitter electron source
101 computer
102 controller
103 heating power supply
104 extraction power supply
105 extraction electrode
106 electron beam
107 acceleration power supply
108 positive electrode
109 first condenser lens
110 aperture stop
111 second condenser lens
112 objective lens
113 astigmatism correction coil
114 deflection scanning coil
115 sample
116 secondary electron detector

The invention claimed is:

1. An electron source comprising:
a columnar chip of a hexaboride single crystal;
a metal pipe that holds the columnar chip of the hexaboride single crystal;
a filament connected to the metal pipe at a central portion; and
a stem provided with a pair of electrodes each connected to a respective one of end portions at two sides of the filament, wherein
the columnar chip of the hexaboride single crystal is formed into a cone shape at a portion closer to a tip than a portion held in the metal pipe, and a tip end portion having the cone shape has a (310) crystal face,
the columnar chip of the hexaboride single crystal emits Schottky electrons by heating the columnar chip so that a chip temperature is higher than 1000° C. and smaller than 1250° C.

2. The electron source according to claim 1, wherein the hexaboride single crystal is a hexaboride of Ce or a hexaboride of a lanthanoid metal heavier than Ce.

3. The electron source according to claim 1, wherein the tip end portion has a substantially hemispherical shape.

4. The electron source according to claim 3, wherein a radius of curvature of the tip end portion is larger than 50 nm and smaller than 1 μm.

5. The electron source according to claim 3, wherein a radius of curvature of the tip end portion is larger than 150 nm and smaller than 500 nm.

6. The electron source according to claim 1, wherein the columnar chip of the hexaboride single crystal has a quadrangular columnar shape or a cylindrical shape, and the portion formed into the cone shape has a quadrangular pyramid shape or a cone shape.

7. The electron source according to claim 1, wherein the columnar chip of the hexaboride single crystal emits Schottky electrons by applying an electric field so that an electric field intensity of the tip end portion is larger than $3 \times 10^8$ V/m and smaller than $1.5 \times 10^9$ V/m.

8. An electron beam device comprising:
an electron source;
a sample stage on which a sample is placed;
an extraction electrode that extracts electrons from the electron source;
an acceleration electrode that accelerates the electrons extracted by the extraction electrode;
a lens system including an objective lens that focuses the electrons accelerated by the acceleration electrode;
a deflection scanning unit that scans and irradiates the sample placed on the sample stage with the electrons focused by the lens system including the objective lens;
a secondary electron detection unit that detects secondary electrons generated from the sample scanned and irradiated with the electrons by the deflection scanning unit; and
a heating unit that maintains the columnar chip of the hexaboride single crystal at a temperature higher than 1000° C. and lower than 1250° C., wherein
the electron source includes a columnar chip of a hexaboride single crystal, a metal pipe that holds the columnar chip of the hexaboride single crystal, a filament connected to the metal pipe at a central portion, and a stem provided with a pair of electrodes each connected to a respective one of end portions at two sides of the filament,
the columnar chip of the hexaboride single crystal is formed into a cone shape at a portion closer to a tip than a portion held in the metal pipe, and a tip end portion having the cone shape has a (310) crystal face, and
Schottky electrons are emitted from the (310) crystal face by heating the columnar chip so that a chip temperature is higher than 1000° C. and smaller than 1250° C.

9. The electron beam device according to claim 8, further comprising:
a heating unit that maintains the columnar chip of the hexaboride single crystal at a temperature higher than 1000° C. and lower than 1100° C.

10. The electron beam device according to claim 8, further comprising:
an extraction power supply that applies a positive voltage to the extraction electrode relative to the columnar chip of the hexaboride single crystal of the electron source, wherein
an electric field having an electric field intensity F of $3 \times 10^8$ V/m $< F < 1.5 \times 10^9$ V/m is applied to a tip end of the columnar chip by applying the positive voltage to the extraction electrode relative to the columnar chip by the extraction power supply, and electrons are emitted from the tip end of the columnar chip.

11. The electron beam device according to claim 8, wherein
the hexaboride single crystal is a hexaboride of Ce or a hexaboride of a lanthanoid metal heavier than Ce, and the tip end portion has a substantially hemispherical shape, and a radius of curvature of the tip end portion is larger than 50 nm and smaller than 1 μm.

\* \* \* \* \*